(12) United States Patent
Cok

(10) Patent No.: US 10,468,391 B2
(45) Date of Patent: Nov. 5, 2019

(54) INORGANIC LIGHT-EMITTING-DIODE DISPLAYS WITH MULTI-ILED PIXELS

(71) Applicant: X-Celeprint Limited, Cork (IE)

(72) Inventor: Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/891,211

(22) Filed: Feb. 7, 2018

(65) Prior Publication Data

US 2018/0226386 A1 Aug. 9, 2018

Related U.S. Application Data

(60) Provisional application No. 62/456,451, filed on Feb. 8, 2017.

(51) Int. Cl.
*H01L 33/48* (2010.01)
*H01L 25/075* (2006.01)
(Continued)

(52) U.S. Cl.
CPC ........ *H01L 25/0753* (2013.01); *H01L 25/167* (2013.01); *H01L 27/124* (2013.01);
(Continued)

(58) Field of Classification Search
CPC ... H01L 25/0753; H01L 33/62; H01L 25/167; H01L 33/0079; H01L 27/124; H01L 2224/18; H01L 25/13; H01L 2933/0066
See application file for complete search history.

(56) References Cited

U.S. PATENT DOCUMENTS

| | | |
|---|---|---|
| 5,886,401 A | 3/1999 | Liu |
| 5,994,722 A | 11/1999 | Averbeck et al. |
| | (Continued) | |

FOREIGN PATENT DOCUMENTS

| | | |
|---|---|---|
| JP | 2010-103186 A | 5/2010 |
| JP | 2013-221965 A | 10/2013 |
| | (Continued) | |

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Ahmed N Sefer
(74) *Attorney, Agent, or Firm* — William R. Haulbrook; Michael D. Schmitt; Choate, Hall & Stewart LLP

(57) ABSTRACT

An inorganic light-emitting diode (iLED) display comprises a separate, independent, and distinct display substrate having a display area. A plurality of spatially separated pixels are distributed on or over the display substrate in the display area. Each pixel includes a group of two or more spatially separated iLEDs each having an iLED substrate separate, independent, and distinct from the display substrate. The two or more iLEDs are electrically connected in common to emit light together in response to a control signal. The pixels can include multiple groups of two or more iLEDs, each group of iLEDs can emit a different color of light to make a full-color display. The iLED display can be a passive-matrix display or include a pixel controller in an active-matrix configuration. The iLEDs and pixel controller can be provided on a pixel substrate disposed on the display substrate.

27 Claims, 16 Drawing Sheets

(51) Int. Cl.
  *H01L 27/12* (2006.01)
  *H01L 33/00* (2010.01)
  *H01L 25/16* (2006.01)
  *H01L 33/62* (2010.01)
  *H01L 25/13* (2006.01)

(52) U.S. Cl.
  CPC .......... *H01L 33/0079* (2013.01); *H01L 25/13* (2013.01); *H01L 33/62* (2013.01); *H01L 2224/18* (2013.01); *H01L 2933/0066* (2013.01)

(56) References Cited

U.S. PATENT DOCUMENTS

| | | |
|---|---|---|
| 6,142,358 A | 11/2000 | Cohn et al. |
| 6,825,559 B2 | 11/2004 | Mishra et al. |
| 6,881,946 B2 | 4/2005 | Cok et al. |
| 7,157,838 B2 | 1/2007 | Thielemans et al. |
| 7,195,733 B2 | 3/2007 | Rogers et al. |
| 7,394,194 B2 | 7/2008 | Cok |
| 7,408,296 B2 | 8/2008 | Cok et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,990,058 B2 | 8/2011 | Cok et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,394,706 B2 | 3/2013 | Nuzzo et al. |
| 8,440,546 B2 | 5/2013 | Nuzzo et al. |
| 8,506,867 B2 | 8/2013 | Menard |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,877,648 B2 | 11/2014 | Bower et al. |
| 8,889,485 B2 | 11/2014 | Bower |
| 8,895,406 B2 | 11/2014 | Rogers et al. |
| 8,896,505 B2 | 11/2014 | Cok et al. |
| 8,912,020 B2 | 12/2014 | Bedell et al. |
| 8,987,765 B2 | 3/2015 | Bibl et al. |
| 9,105,714 B2 | 8/2015 | Hu et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,358,775 B2 | 6/2016 | Bower et al. |
| 9,362,348 B2 | 6/2016 | Lowenthal et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,520,537 B2 | 12/2016 | Bower et al. |
| 9,537,069 B1 | 1/2017 | Bower et al. |
| 9,590,025 B2 | 3/2017 | Yu et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2 | 12/2017 | Wu et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,991,163 B2 | 6/2018 | Bower et al. |
| 9,997,501 B2 | 6/2018 | Bower et al. |
| 10,078,239 B2 | 9/2018 | Sugita et al. |
| 10,103,069 B2 | 10/2018 | Bower et al. |
| 10,209,813 B2 | 2/2019 | Yao et al. |
| 2001/0022564 A1 | 9/2001 | Youngquist et al. |
| 2002/0084952 A1 | 7/2002 | Morley et al. |
| 2002/0096994 A1 | 7/2002 | Iwafuchi et al. |
| 2002/0118321 A1 | 8/2002 | Ge |
| 2003/0117369 A1 | 6/2003 | Spitzer et al. |
| 2004/0080941 A1* | 4/2004 | Jiang ............... H01L 24/18 362/84 |
| 2005/0264472 A1 | 12/2005 | Rast |
| 2005/0275615 A1 | 12/2005 | Kahen et al. |
| 2006/0063309 A1 | 3/2006 | Sugiyama et al. |
| 2006/0132671 A1 | 6/2006 | Koma |
| 2006/0180818 A1* | 8/2006 | Nagai ............... F21K 9/00 257/89 |
| 2006/0289972 A1 | 12/2006 | Nishimura et al. |
| 2008/0108171 A1 | 5/2008 | Rogers et al. |
| 2008/0211734 A1 | 9/2008 | Huitema et al. |
| 2009/0146921 A1 | 6/2009 | Takahashi |
| 2009/0278142 A1 | 11/2009 | Watanabe et al. |
| 2010/0060553 A1 | 3/2010 | Zimmerman et al. |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0201253 A1 | 8/2010 | Cok et al. |
| 2010/0207852 A1 | 8/2010 | Cok |
| 2010/0248484 A1 | 9/2010 | Bower et al. |
| 2010/0317132 A1 | 12/2010 | Rogers et al. |
| 2011/0043435 A1 | 2/2011 | Hebenstreit et al. |
| 2011/0108800 A1 | 5/2011 | Pan |
| 2012/0018745 A1 | 1/2012 | Liu et al. |
| 2012/0126229 A1 | 5/2012 | Bower |
| 2012/0193652 A1 | 8/2012 | Horng et al. |
| 2012/0206499 A1 | 8/2012 | Cok |
| 2012/0212465 A1 | 8/2012 | White et al. |
| 2012/0228669 A1 | 9/2012 | Bower et al. |
| 2012/0314388 A1 | 12/2012 | Bower et al. |
| 2012/0320581 A1 | 12/2012 | Rogers et al. |
| 2013/0010405 A1 | 1/2013 | Rothkopf et al. |
| 2013/0015483 A1 | 1/2013 | Shimokawa et al. |
| 2013/0036928 A1 | 2/2013 | Rogers et al. |
| 2013/0069275 A1 | 3/2013 | Menard et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0221355 A1 | 8/2013 | Bower et al. |
| 2013/0248889 A1 | 9/2013 | Lin |
| 2013/0273695 A1 | 10/2013 | Menard et al. |
| 2014/0014960 A1 | 1/2014 | Yamazaki et al. |
| 2014/0027709 A1 | 1/2014 | Higginson et al. |
| 2014/0084240 A1 | 3/2014 | Hu et al. |
| 2014/0084482 A1 | 3/2014 | Hu et al. |
| 2014/0094878 A1 | 4/2014 | Gossler et al. |
| 2014/0159043 A1 | 6/2014 | Sakariya et al. |
| 2014/0159065 A1 | 6/2014 | Hu et al. |
| 2014/0168037 A1 | 6/2014 | Sakariya et al. |
| 2014/0225938 A1 | 8/2014 | Soni et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0015517 A1 | 1/2015 | Zhao |
| 2015/0084054 A1 | 3/2015 | Fan et al. |
| 2015/0135525 A1 | 5/2015 | Bower |
| 2015/0137153 A1 | 5/2015 | Bibl et al. |
| 2015/0169011 A1 | 6/2015 | Bibl et al. |

(56) References Cited

U.S. PATENT DOCUMENTS

| | | |
|---|---|---|
| 2015/0170602 A1 | 6/2015 | Kang |
| 2015/0255438 A1 | 9/2015 | Oraw et al. |
| 2015/0263256 A1* | 9/2015 | Hsieh .................. H01L 33/62 257/91 |
| 2015/0279822 A1* | 10/2015 | Hsu .................... H01L 25/0753 257/89 |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2016/0103547 A1 | 4/2016 | Lu et al. |
| 2016/0210895 A1* | 7/2016 | Fan ..................... G09G 3/3208 |
| 2016/0343772 A1 | 11/2016 | Bower et al. |
| 2016/0351539 A1 | 12/2016 | Bower et al. |
| 2016/0370855 A1 | 12/2016 | Lanier et al. |
| 2017/0005244 A1 | 1/2017 | Bower et al. |
| 2017/0010706 A1* | 1/2017 | Cok ..................... G06F 3/044 |
| 2017/0025075 A1 | 1/2017 | Cok et al. |
| 2017/0025395 A1* | 1/2017 | Chen .................. H01L 25/0753 |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0148771 A1* | 5/2017 | Cha ................... H01L 25/0753 |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0221266 A1 | 8/2017 | Schubert et al. |
| 2017/0250167 A1 | 8/2017 | Bower et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0338374 A1 | 11/2017 | Zou et al. |
| 2017/0352646 A1 | 12/2017 | Bower et al. |
| 2017/0352647 A1 | 12/2017 | Raymond et al. |
| 2017/0357127 A1* | 12/2017 | Cok .................. G02F 1/133606 |
| 2017/0358717 A1 | 12/2017 | Cok et al. |
| 2018/0007750 A1* | 1/2018 | Meitl .................. H01L 27/0288 |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0174932 A1 | 6/2018 | Cok et al. |
| 2018/0175248 A1 | 6/2018 | Ahmed |
| 2018/0197471 A1 | 7/2018 | Rotzoll et al. |
| 2018/0211945 A1 | 7/2018 | Cok et al. |
| 2018/0277525 A1 | 9/2018 | Cok et al. |
| 2018/0323180 A1 | 11/2018 | Cok |
| 2018/0340681 A1 | 11/2018 | Cok |
| 2018/0366450 A1 | 12/2018 | Gardner et al. |
| 2019/0027534 A1 | 1/2019 | Rotzoll et al. |
| 2019/0088630 A1 | 3/2019 | Cok et al. |

FOREIGN PATENT DOCUMENTS

| | | |
|---|---|---|
| WO | WO-2006/027730 A1 | 3/2006 |
| WO | WO-2010/111601 A2 | 9/2010 |
| WO | WO-2010/132552 A1 | 11/2010 |
| WO | WO-2013/011415 A1 | 1/2013 |
| WO | WO-2013/064800 A1 | 5/2013 |
| WO | WO-2014/149864 A1 | 9/2014 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Hamer et al., 63.2: AMOLED Displays Using Transfer-Printed Integrated Circuits, SID 09 Digest, 40(2):947-950 (2009).

Yoon, J. et al., Heterogeneously Integrated Optoelectronic Devices Enabled by MicroTransfer Printing, Adv. Optical Mater. 3:1313-1335 (2015).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

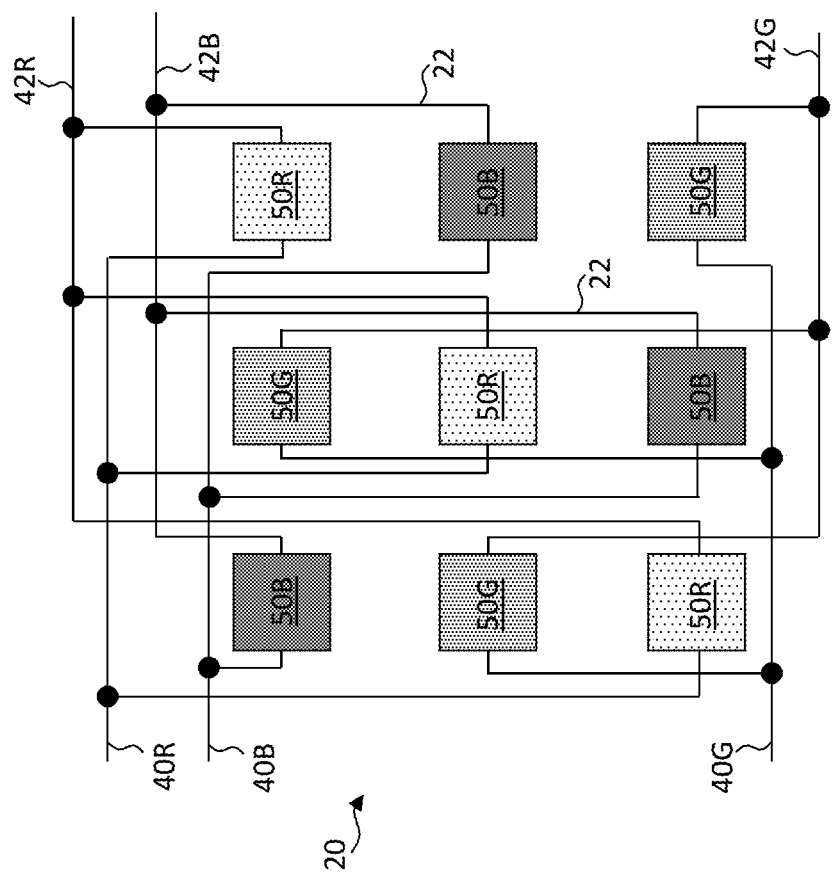

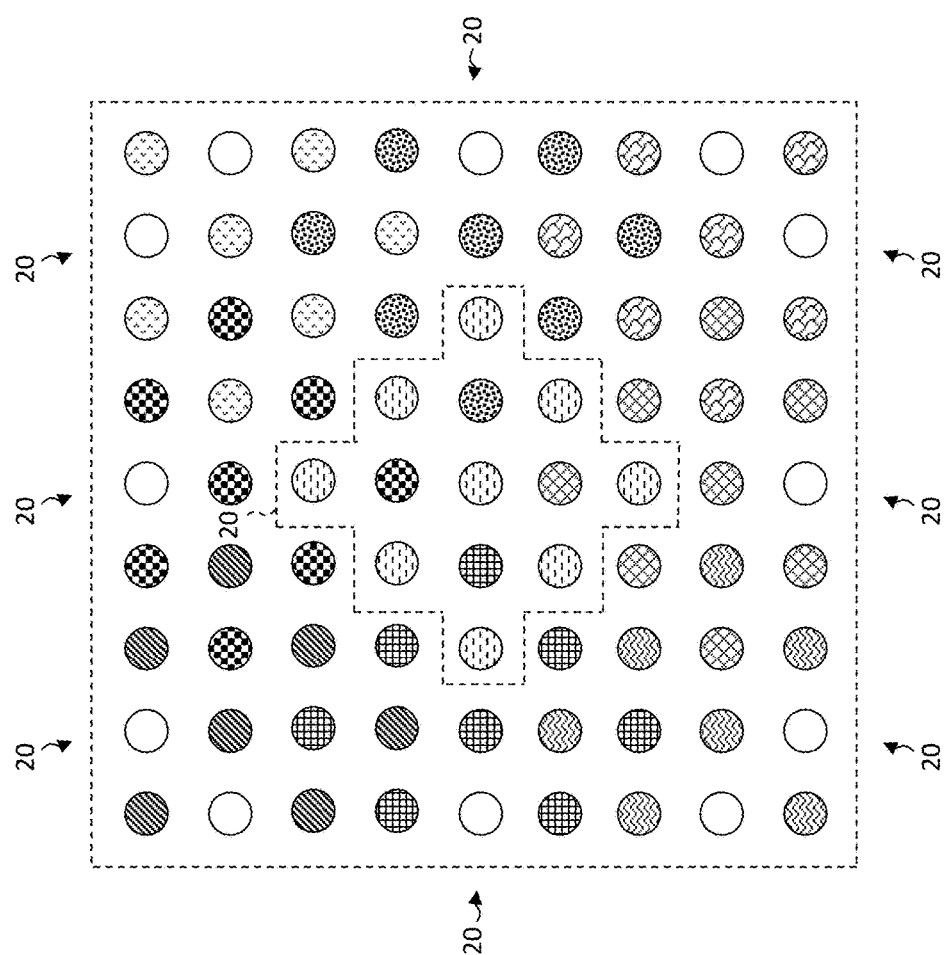

INORGANIC LIGHT-EMITTING-DIODE DISPLAYS WITH MULTI-ILED PIXELS

PRIORITY APPLICATION

This application claims the benefit of U.S. Provisional Patent Application No. 62/456,451, filed Feb. 8, 2017, entitled Inorganic Light-Emitting-Diode Display with Multi-iLED Pixels, the disclosure of which is incorporated by reference herein in its entirety.

FIELD OF THE INVENTION

The present invention relates generally to inorganic light-emitting diode displays with multiple inorganic light-emitting diodes for each pixel.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode displays rely on passing current through a layer of organic material that glows in response to the current. Displays are typically controlled with either a passive-matrix (PM) control employing electronic circuitry external to the display substrate or an active-matrix (AM) control employing electronic circuitry formed directly on the display substrate and associated with each light-emitting element. Both active- and passive-matrix-controlled OLED and LC displays are available. An example of such an AM OLED display device is disclosed in U.S. Pat. No. 5,550,066.

The amount of light emitted from an LCD is determined by the brightness of the backlight, the transmissivity of the liquid crystals, and the area of the display through which light is emitted. A larger pixel area will transmit more light than a smaller pixel area. Hence, to achieve a desirably bright LCD, the pixel areas are preferably large. In contrast, the brightness of an OLED display depends on the current density passed through the OLED pixels. At higher current densities, brightness is increased and lifetime is decreased. Thus, a larger light-emitting OLED area will increase the lifetime of an OLED display by reducing the current density or enable an increased current and brightness without increasing the current density or reducing the OLED lifetime. It is therefore also preferred that OLED pixels are large.

Inorganic light-emitting diode (iLED) displays are used in public spaces and are viewed at a wide range of distances by different viewers in the public space. Displays using micro-iLEDs (for example having an area less than 1 mm square, less than 100 microns square, or less than 50 microns square or having an area small enough that it is not visible to an unaided observer of the display at a designed viewing distance) are also described. For example, U.S. Pat. No. 8,722,458 entitled Optical Systems Fabricated by Printing-Based Assembly teaches, inter alia, transferring light-emitting, light-sensing, or light-collecting semiconductor elements from a wafer substrate to a destination substrate. Inorganic light-emitting diodes are commonly made in large quantities on semiconductor substrates. However, variability in materials and process result in iLEDs that have a corresponding variability in color, brightness, and efficiency.

Full-color displays have pixels that include multiple sub-pixel light emitters that each emit different colors of light. The different colors define the color gamut of the display and are intended to be viewed as a single emissive element having a color defined by the combination of colors emitted by the individual sub-pixel light emitters. The resolution of the display is specified by the number of pixels in the display per linear metric, for example pixels per inch. However, when viewed at ranges closer than the designed viewing distance for the display, for example in interior public spaces, the individual pixels can be distinguished and the individual color sub-pixel light emitters can be perceptible, increasing display pixelation and decreasing viewer satisfaction with the display. Furthermore, fixed pattern noise, such as the screen-door effect, can become visible.

There is a need, therefore, for inorganic light-emitting diode displays that provide improved color mixing and improved brightness and provide reduced pixelation, reduced fixed-pattern noise, and reduced variability in color, efficiency, and brightness.

SUMMARY OF THE INVENTION

The present invention provides, inter alia, an inorganic light-emitting diode (iLED) display comprising a display substrate having a display area and a plurality of spatially separated pixels distributed on or over the display substrate in the display area, wherein each pixel includes a group of two or more spatially separated iLEDs each having an iLED substrate separate, independent, and distinct from the display substrate, the two or more iLEDs electrically connected in common to emit light together in response to a control signal.

The two or more iLEDs can be electrically connected in parallel or in series and can emit the same color of light, can emit white light, or can emit different colors of light. In certain embodiments, the different colors of light combine to be perceived as white.

The pixel can be distributed in a regular array over the display area. In certain embodiments, the iLEDs in a display or within a pixel are distributed in a regular array.

In certain embodiments, each pixel includes a first group of two or more iLEDs and a second group of two or more iLEDs different from the first group. The two or more iLEDs in the first group emit light of a different color than the two or more iLEDs in the second group. The two or more iLEDs in the first group can be interdigitated with the two or more iLEDs in the second group of the pixel. Furthermore, each pixel can include a first group of two or more iLEDs, a second group of two or more iLEDs, and a third group of two or more iLEDs. The first, second, and third groups are all different groups, and the first group emits red light, the second group emits green light, and the third group emits blue light. The two or more iLEDs of each of the first, second, and third groups can be interdigitated with the two or more iLEDs of the other two groups in the pixel.

In certain embodiments, the iLED display is a full-color display, the iLED display is a passive-matrix display, or the iLED display is an active-matrix display.

In certain embodiments, the two or more iLEDs of each pixel of the plurality of pixels are disposed on a pixel substrate and the pixel substrate for each pixel is disposed on the display substrate.

In certain embodiments, the display substrate includes display substrate contact pads and the pixel substrate includes pixel connection posts that are electrically connected to at least a portion of the contact pads and directly or indirectly electrically connected to the iLEDs of the plurality of pixels. An indirect electrical connection is an electrical connection through another device or element, such as a pixel controller.

In certain embodiments, the iLED display includes a pixel controller having a controller substrate separate, independent, and distinct from the display substrate and the iLED substrates. The pixel controller controls the two or more iLEDs to emit light in response to the control signal. The pixel controller can be disposed on the pixel substrate, if present.

In certain embodiments, the plurality of pixels includes a first pixel spatially adjacent to a second pixel and at least one of the two or more iLEDs of the first pixel is disposed between two of the two or more iLEDs of the second pixel so that the first pixel overlaps the second pixel over the display substrate (e.g., the first and second pixels are interdigitated). In certain embodiments, the plurality of pixels includes a third pixel spatially adjacent to the first pixel on a side of the first pixel opposite the second pixel and at least one of the two or more iLEDs of the first pixel is disposed between two of the two or more iLEDs of the third pixel so that the first pixel overlaps the third pixel over the display substrate. In certain embodiments, the first pixel has four sides and the plurality of pixels includes a fourth pixel and a fifth pixel. Each of the second, third, fourth and fifth pixels is spatially adjacent to a different one of the four sides and at least one of the two or more iLEDs of the first pixel is disposed between two of the two or more iLEDs of the second pixel, at least one of the two or more iLEDs of the first pixel is disposed between two of the two or more iLEDs of the third pixel, at least one of the two or more iLEDs of the first pixel is disposed between two of the two or more iLEDs of the fourth pixel, and at least one of the two or more iLEDs of the first pixel is disposed between two of the two or more iLEDs of the fourth pixel.

In certain embodiments, a method of making an iLED pixel comprises providing an iLED source wafer having micro-transfer printable iLEDs, providing a pixel substrate having at least two externally controlled control wires, wherein at least one control wire is a modulated control wire and the pixel substrate has lateral dimensions less than 1 cm, micro-transfer printing two or more iLEDs from the iLED source wafer to the pixel substrate, electrically connecting the two or more iLEDs in common, and electrically connecting the two or more iLEDs to the two control wires. The method can also include providing a controller source wafer having micro-transfer printable pixel controllers, micro-transfer printing a pixel controller from the controller source wafer to the pixel substrate, and electrically connecting the pixel controller to the control wires and the two or more iLEDs.

In certain embodiments of the present invention, a pixel source wafer comprises a source wafer having a plurality of sacrificial portions and a plurality of pixels each disposed entirely over a corresponding sacrificial portion. Each pixel has a pixel substrate, a group of two or more spatially separated iLEDs each having a separate, independent, and distinct iLED substrate different from the pixel substrate and the source wafer, the two or more iLEDs electrically connected in common to emit light together in response to a control signal. Each pixel can comprise a pixel controller electrically connected to the iLEDs to control the iLEDs to emit light in response to the control signal. The pixel controllers can each be micro-transfer printed and can include one or more broken or separated tethers. Likewise, the iLEDs can each be micro-transfer printed and can include one or more broken or separated tethers. The corresponding sacrificial portion can define a gap between the pixel substrate and the source wafer such that one or more tethers connect each of the plurality of pixels disposed over the corresponding sacrificial portion to one or more anchor portions of the source wafer. Each of the plurality pixels can include one or more connection posts.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 5 is a schematic of a color pixel group, according to illustrative embodiments of the present invention;

FIG. 10 is a plan view schematic of light emitters with pixels overlapping in two dimensions (e.g., in an iLED display), according to illustrative embodiments of the present invention;

The features and advantages of the present disclosure will become more apparent from the detailed description set forth below when taken in conjunction with the drawings, in

DETAILED DESCRIPTION OF THE INVENTION

Certain embodiments of the present invention provide an inorganic light-emitting diode (iLED) display having multiple iLED light emitters per pixel. In certain embodiments, multiple light emitters reduce one or more of fixed pattern noise, screen door effects, pixelation, and color, brightness, and efficiency variation and improve one or more of brightness and color mixing within a pixel.

Figure 1:
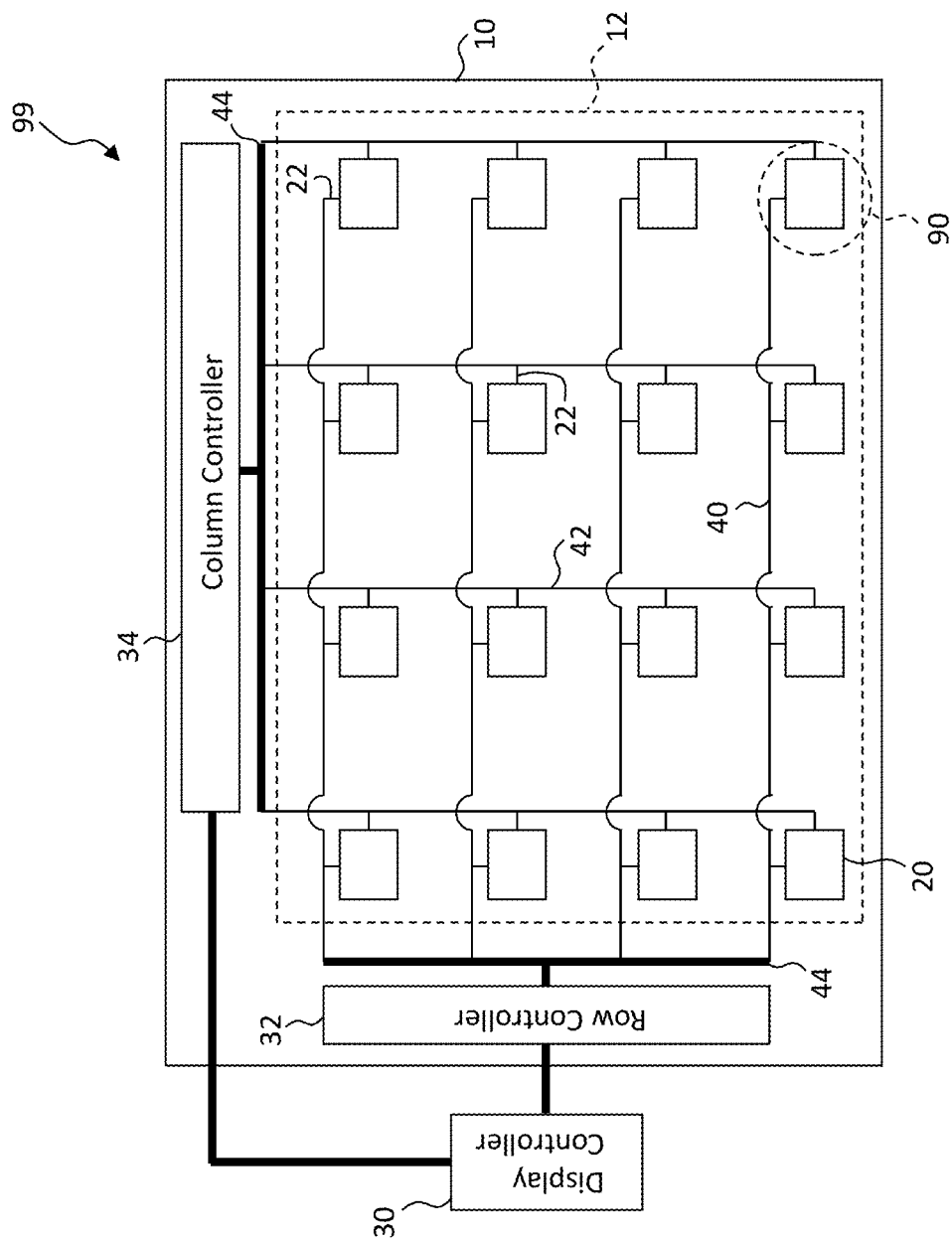
FIG. 1 is a plan view schematic of an iLED display, according to illustrative embodiments of the present invention.

Referring to the plan view schematic of FIG. 1, in some embodiments of the present invention, an inorganic light-emitting diode (iLED) display 99 comprises a separate, independent, and distinct display substrate 10 having a display area 12. A plurality of spatially separated pixels 20 are distributed (e.g., regularly) over the display substrate 10 in the display area 12. Each pixel 20 includes a group of two or more spatially separated iLEDs 50, for example, as shown in the detail 90 in FIGS. 2-4 and the pixel 20 in FIG. 5. Each iLED 50 has an iLED substrate separate, independent, and distinct from the display substrate 10. (The iLEDs 50 and their corresponding iLED substrates are not distinguished in each of the Figures.) The two or more iLEDs 50 in the group are electrically connected in common, for example through wires 22 in the pixel 20, to emit light together and at the same time in response to a common control signal supplied to the two or more iLEDs 50. Thus, the iLEDs 50 in the group cannot be independently controlled; a signal provided to one of the iLEDs 50 in the group is provided to all of the iLEDs 50 in the group.

Referring to FIG. 1, the pixels 20 in the iLED display 99 can be controlled through row signals provided on row lines 40 from a row controller 32 and column signals provided on column lines 42 from a column controller 34. In an exemplary full-color iLED display 99, according to certain embodiments of the present invention, additional row and column lines 40, 42 can be provided to control correspondingly different colors of iLEDs 50 (not shown in FIG. 1). Row and column lines 40, 42 can include pixel wires 22 or the pixel wires 22 can be separate from the row and column lines 40, 42. A row controller 32, column controller 34, and a display controller 30 together can provide passive- or active-matrix addressed signals to pixels 20 to control iLEDs 50 to emit light. A row controller 32, column controller 34, and display controller 30 can be integrated circuits (ICs) disposed on a display substrate 10 outside a display area 12 or on an external substrate and can be electrically connected to pixels through buses 44. Row and column designations are arbitrary and embodiments where row and column designations are exchanged are also contemplated. Power and ground lines are not shown, to simplify the Figures, but can be supplied to the various integrated circuits and pixels 20 in a given embodiment.

An integrated circuit can be a silicon semiconductor device provided with one or more logic circuits to control a pixel 20. A display substrate 10 can be a flat-panel display substrate, for example made of glass, plastic, ceramic, or metal and can be rigid or flexible. Row and column lines 40, 42 can be patterned metal wires or other electrically conductive traces formed in or patterned on a display substrate 10 and can conduct electrical signals to control pixels 20. In addition to a group of two or more iLEDs 50, a pixel 20 can include wires 22 connected to the iLEDs 50. In some embodiments, wherein a display 99 is an active-matrix display, control circuitry for controlling the group of two or more iLEDs 50 is included as well. Control circuitry can be provided in thin-film transistors formed in a layer of semiconductor material disposed over a display substrate 10 in a display area 12. In some embodiments, control circuitry is provided in micro-ICs distributed over a display substrate 10 in a display area 12. Thus, in certain embodiments that are passive-matrix configurations, row and column lines 40, 42 are directly connected to groups of iLEDs 50 and in certain embodiments that are active-matrix configurations, row and column lines 40, 42 are indirectly connected to groups of iLEDs 50 through control circuitry.

Figure 2:
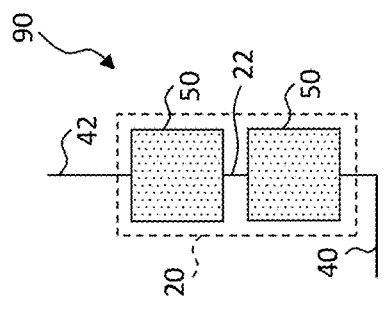

In some embodiments of the present invention, a group of two or more iLEDs 50 in a pixel 20 are connected in common in series, as shown in FIG. 2. In the exemplary embodiment shown in FIG. 2, the column line 42 is electrically connected to one iLED 50 and the row line 40 is electrically connected to the other iLED 50, and the two iLEDs 50 are connected together through a wire 22. Electrical current at a sufficient voltage is provided to one iLED 50, for example from the column line 42, passes through the one iLED 50, through the wire 22, and then through the other iLED 50 to the row line 40, so that both iLEDs 50 are controlled to emit light together at the same time in response to an electrical signal provided through the row or column lines 40, 42.

Figure 4:
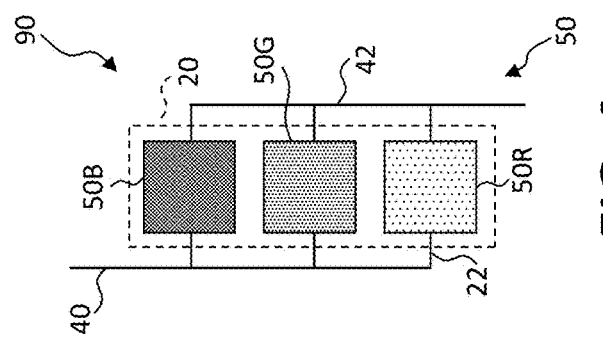
FIGS. 2-4 are detail schematics of pixel groups for use in an iLED display (e.g., as shown in of FIG. 1), according to illustrative embodiments of the present invention.
Figure 3:
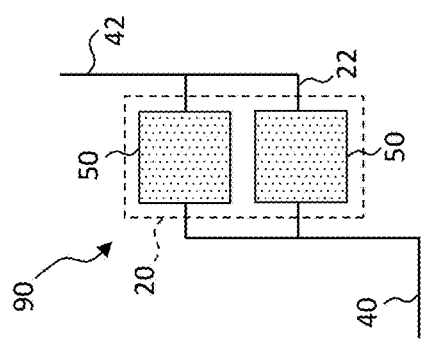

In some embodiments of the present invention, a group of two or more iLEDs 50 in a pixel 20 are electrically connected in common in parallel, as shown, for example, in FIGS. 3 and 4. In the exemplary embodiments shown in FIGS. 3 and 4, the column line 42 and the row line 40 are both electrically connected in common to each of the two or more iLEDs 50 in the pixel 20. Electrical current at a sufficient voltage is provided to all of the iLEDs 50 in the group, for example from the column line 42, passes through the iLEDs 50 at the same time to the row line 40, so that all of the iLEDs 50 in the group are controlled to emit light together at the same time in response to an electrical signal provided through the row or column lines 40, 42.

In some embodiments of the present invention, as illustrated in FIGS. 2 and 3, two iLEDs 50 in a group emit substantially the same color of light when provided by electrical power, indicated by the common shading of the iLEDs 50 indicated in FIGS. 2 and 3. However, because iLEDs 50 made by practical manufacturing processes can have some variability, the iLEDs 50 can emit slightly different colors. The light emitted from the iLEDs 50 in a pixel is averaged by the human visual system thereby reducing the perceived color variation of a plurality of pixels 20 emitting light of a substantially common color. Light of a substantially common color is light that is desired to be the same color but that, because of manufacturing variability, is not necessarily identical. In some embodiments, each of the iLEDs 50 includes one or more color change materials, such as phosphors or quantum dots, that convert a portion of the light emitted by the iLED 50 and that, in combination with the light emitted by the iLED 50, emit light that is perceived to be white.

In some embodiments of the present invention, as illustrated in FIG. 4, two or more iLEDs 50 in a group emit different colors of light when provided by electrical power, indicated by the different shading of the iLEDs 50 indicated in FIG. 4. The light emitted from the different iLEDs 50 is together combined by the human visual system. Depending on the colors of light emitted by the iLEDs 50 in the group, for example red light emitted by red iLED 50R, green light emitted by green iLED 50G, and blue light emitted by blue iLED 50B (collectively iLEDs 50), the combined light can be perceived to be white.

Referring to FIG. 5, each pixel 20 can be a full-color pixel 20 that can be controlled to emit desired combinations of different colors of light, for example red, green, and blue light, so that the iLED display 99 is a full-color display. In this exemplary embodiment, the pixel 20 includes a plurality of groups of two or more iLEDs 50. The pixel 20 includes a group of three red iLEDs 50R that each emit red light, a group of three green iLEDs 50G that each emit green light, and a group of three blue iLEDs 50B that each emit blue light (collectively iLEDs 50). The different groups of two or more iLEDs 50 are separately controlled but the iLEDs 50 in each group are all commonly controlled and responsive to the same, common control signal. The red iLEDs 50R are controlled in common by the row and column lines 40R, 42R through wires 22, the green iLEDs 50G are controlled in common by the row and column lines 40G, 42G through wires 22, and the blue iLEDs 50B are controlled in common by the row and column lines 40B, 42B (collectively row or column lines 40, 42) through wires 22. Thus, each pixel 20 includes a first group of two or more iLEDs 50 (e.g., red ILED 50R) and a second group of two or more iLEDs 50 (e.g., green iLEDs 50G) different from the first group. The two or more iLEDs (e.g., red iLED 50R) in the first group emit light of a different color than the two or more iLEDs 50 in the second group (e.g., green iLEDs 50G) of the pixel 20. Furthermore, the exemplary embodiment shown in FIG. 5 includes a third group of two or more iLEDs (e.g., blue iLEDs 50B) that emit a color of light (e.g., blue light) different from the light emitted by the first and second groups of iLEDs 50 (e.g., red and green light, respectively).

In some embodiments, and as shown in FIG. 5, two or more iLEDs (e.g., red iLEDs 50R) in a first group are interdigitated with two or more iLEDs (e.g., green iLEDs 50G) in a second group of a pixel 20 and two or more iLEDs (e.g., blue iLEDs 50B) in a third group are interdigitated with the two or more iLEDs 50 of the first and second groups of two or more iLEDs 50. As intended herein, iLEDs 50 in a first group are interdigitated with iLEDs 50 in a second group when at least one iLED 50 in the first group is spatially located between at least two iLEDs 50 in the second group in any direction or dimension on or over a display substrate 10 (FIG. 1) on which the iLEDs 50 are disposed or distributed. In some embodiments, at least one iLED 50 in a second group is located spatially between at least two iLEDs 50 in a first group in any direction or dimension. The direction or dimension is typically a direction parallel to a surface of the display substrate 10 on or over which the iLEDs 50 are disposed or distributed. In the exemplary embodiment shown in FIG. 5, the central red iLED 50R is located between green and blue iLEDs 50G, 50B in each of two orthogonal directions. Two of the green iLEDs 50G in a group are each located between a red iLED 50R and a blue iLED 50B. One of the blue iLEDs 50B is located between a red iLED 50R and a green iLED 50B. By interdigitating iLEDs 50 that emit different colors of light within a pixel 20, the color mixing of the pixel 20 and the perceived image quality of an iLED display 99 can be improved.

Figure 6:
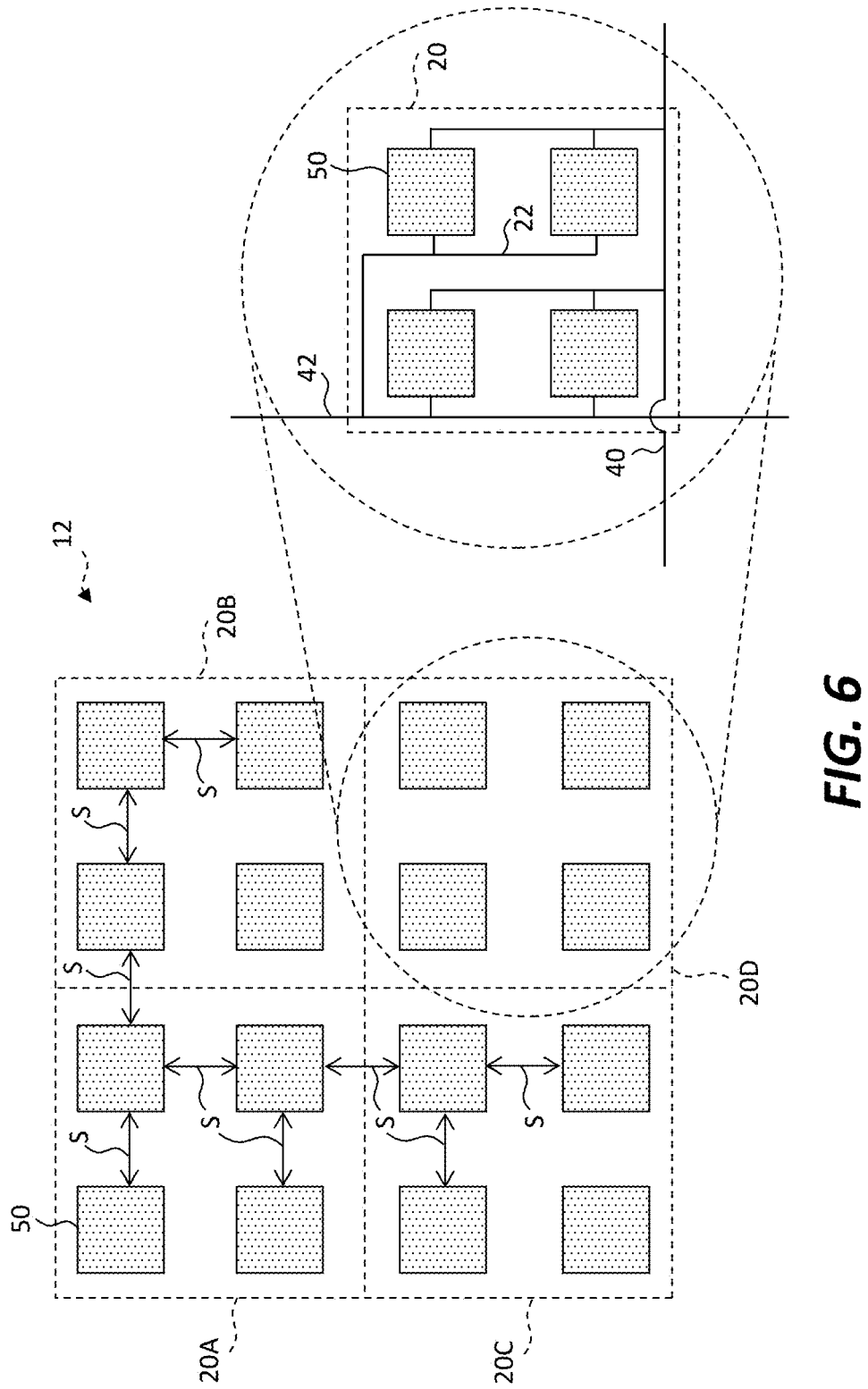
FIGS. 6-7 are schematics illustrating portions of iLED displays, according to illustrative embodiments of the present invention.
Figure 7:
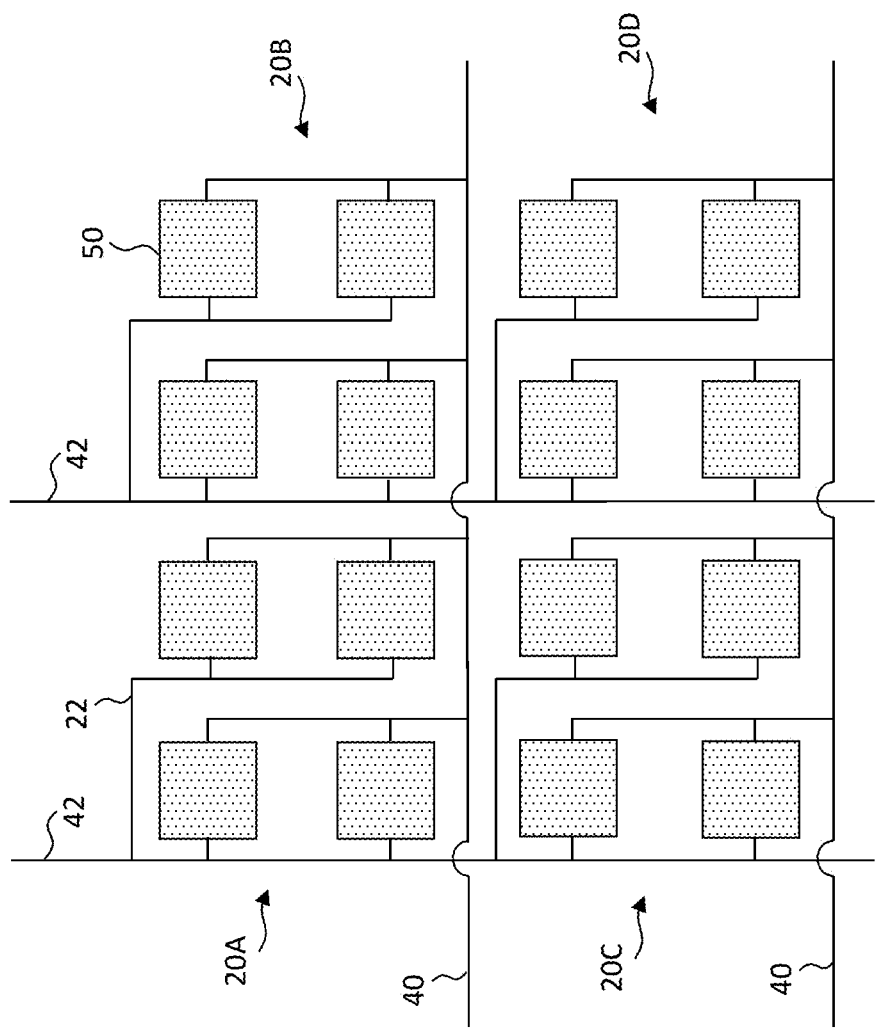

Referring to FIGS. 6 and 7, both the pixels 20 and the iLEDs 50 are distributed in a regular array in the display area 12. As shown in FIG. 6, the iLEDs 50 are separated by a distance S in each of two orthogonal directions in the display area 12. Four pixels 20A, 20B, 20C, and 20D (collectively pixels 20) are shown in a 2×2 arrangement. The two or more iLEDs 50 within each group of iLEDs 50 are each separated within the pixel 20 by the same distance S. Moreover, adjacent iLEDs 50 in adjacent pixels 20 are each separated by the same distance S so that all adjacent iLEDs 50 are spatially separated by the same distance S within the display area 12, thus providing a regular array of iLEDs 50 within the display area 12. Two iLEDs 50 are adjacent when no other iLED 50 is between the two iLEDs 50 in any direction over the displays substrate 10 in the display area 12. In certain embodiments, by disposing the two or more iLEDs 50 within a group uniformly or regularly over the display area 12, fixed pattern noise in the iLED display 99 is reduced, such as any screen door effect in which, for example, black matrix light absorbers form visible lines between the iLEDs 50.

The detail inset of FIG. 6 illustrates the electrical connections with wires 22 from the iLEDs 50 to the row and column lines 40, 42 of a pixel 20. FIG. 7 illustrates the electrical connections with wires 22 of the iLEDs 50 to the row and column lines 40, 42 of all of the pixels 20A, 20B, 20C, 20D. FIGS. 6 and 7 illustrate exemplary embodiments having a parallel electrical connection configuration for the two or more iLEDs 50 of a group within each pixel 20.

Figure 8:
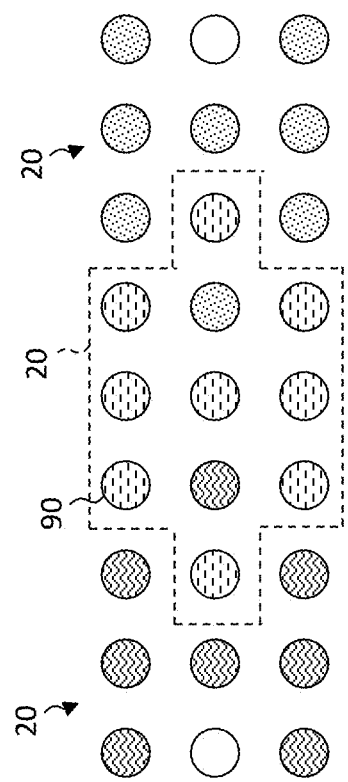
FIG. 8 is a plan view schematic of light emitters with pixels overlapping in one dimension (e.g., in an iLED display), according to illustrative embodiments of the present invention.
Figure 9A:
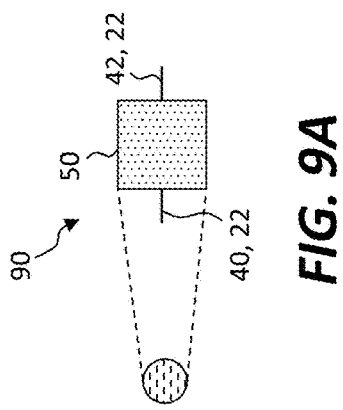
FIGS. 9A, 9B, and 9C are detail schematics of alternative light emitter pixels (e.g., for use in the embodiments shown in FIGS. 8 and 10), according to illustrative embodiments of the present invention.
Figure 9B:
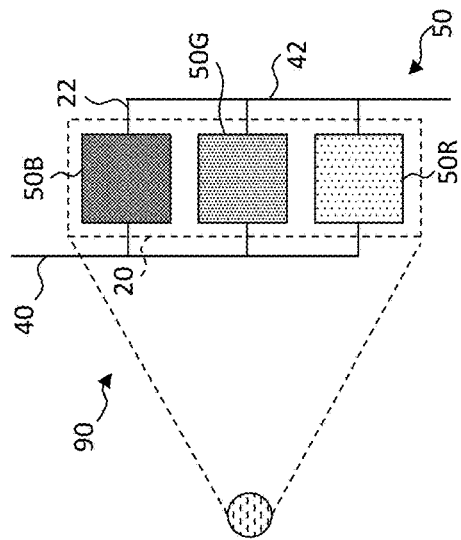
Figure 9C:
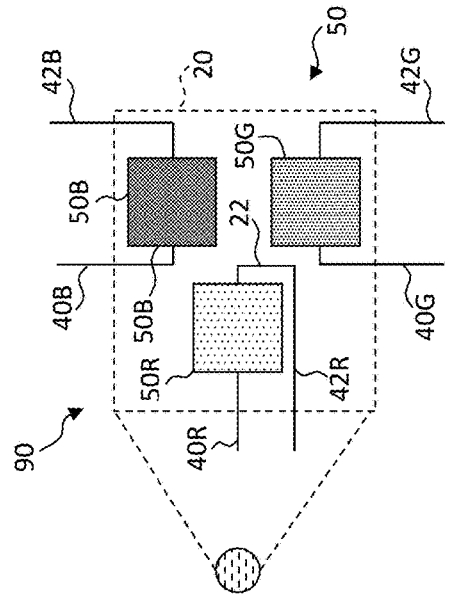

In some embodiments, as illustrated in FIG. 5, iLEDs 50 are interdigitated within one group of two or more commonly controlled iLEDs 50 in a pixel 20. In some embodiments, as illustrated in FIGS. 8 and 10, iLEDs 50 within one group of two or more commonly controlled iLEDs 50 in one pixel 20 are interdigitated with iLEDs 50 within one group of two or more commonly controlled iLEDs 50 in another spatially adjacent pixel 20. Two pixels 20 are adjacent when no other pixel 20 is between the two pixels 20 in any direction over a display substrate 10 in a display area 12. Referring to FIG. 8, each circle 90 represents an iLED 50 as shown in the detail of FIG. 9A or set of iLEDs 50 as shown in the details of FIGS. 9B and 9C. The iLEDs 50 are electrically connected through wires 22 to row and column lines 40, 42. The row and column lines 40, 42 can include the wires 22 or the wires 22 can be considered separate from the row and column lines 40, 42.

Referring to FIG. 9A, a single iLED 50 is electrically connected to the row and column lines 40, 42. Referring to FIG. 9B, three iLEDs 50 that each emit a different color of light (e.g., red iLED 50R, green iLED 50G, and blue iLED 50B) are electrically connected in common to the row and column lines 40, 42 to emit perceptually white light. Referring to FIG. 9C, a trio of separately controlled red, green, and blue iLEDs 50R, 50G, 50B are electrically connected to the red, green, and blue row and column lines 40R, 40G, 40B, 42R, 42G, 42B, respectively. The exemplary embodiment shown in FIG. 9A can correspond to a monochrome iLED display 99, the exemplary embodiment shown in FIG. 9B to a black-and-white iLED display 99, and the exemplary embodiment shown in FIG. 9C to a full-color iLED display 99.

Referring to FIG. 8, one or more of the iLEDs 50 represented by each of the circles with similar shading are electrically connected in common as part of a common group of two or more iLEDs 50 within a pixel 20. Thus, FIG. 8, the pixel 20 has a group of nine commonly connected iLEDs 50 (when in accordance with the exemplary embodiment shown in FIG. 9A) or the pixel 20 has three groups each having nine commonly connected iLEDs 50 (when in accordance with the exemplary embodiment shown in FIG.

9B). Each group of iLEDs 50 can emit different colors of light (e.g., red, green, and blue light). The commonly connected iLEDs 50 in each group are arranged as illustrated in FIG. 8.

Referring still to FIG. 8, each pixel 20 includes at least one group of nine commonly connected iLEDs 50. However, one or more of the iLEDs 50 in each of the at least one group are interdigitated by an iLED 50 of each of at least one group in an adjacent pixel 20. For example, FIG. 8 illustrates three pixels 20 horizontally arranged in a row so that the area encompassed by the central pixel 20 (outlined with dashed lines) includes an iLED 50 from the pixel 20 to the left of the central pixel 20 and an iLED 50 from the pixel 20 to the right of the central pixel 20. Similarly, the area encompassed by the left and right pixels 20 each include one of the iLEDs 50 of the central pixel 20. (The white, unshaded circles 90 represent iLEDs 50 from adjacent pixels 20 that are not otherwise shown in FIG. 8.)

The iLEDs 50 of adjacent pixels 20 are interdigitated in one dimension in the exemplary embodiment shown in FIG. 8. Referring to FIG. 10, the iLEDs 50 of adjacent pixels 20 are interdigitated in two dimensions. FIG. 10 illustrates a 3×3 array of pixels 20 with interdigitated iLEDs 50 in two dimensions. As in FIG. 8, each pixel 20 has one or more groups of nine commonly controlled iLEDs 50 that are commonly connected and each circle can represent any of the iLED 50 structures shown in FIGS. 9A-9C. The white, unshaded circles 90 represent iLEDs 50 from adjacent pixels 20 that are not otherwise shown in FIG. 10. The area encompassed by the central pixel 20 is outlined with dashed lines and shows that an iLED 50 of the central pixel 20 is interdigitated with iLEDs 50 of an adjacent, neighboring pixel 20 on each of the four sides of the central pixel 20. Likewise, an iLED 50 from the pixel 20 to the left of the central pixel 20 is interdigitated with iLEDs 50 of the central pixel 20, an iLED 50 from the pixel 20 to the right of the central pixel 20 is interdigitated with iLEDs 50 of the central pixel 20, an iLED 50 from the pixel 20 above the central pixel 20 is interdigitated with iLEDs 50 of the central pixel 20, and an iLED 50 from the pixel 20 below the central pixel 20 is interdigitated with iLEDs 50 of the central pixel 20. Thus, the four pixels 20 on the sides of the central pixel 20 are similarly interdigitated with their neighbors. In certain embodiments, by interdigitating groups of commonly controlled iLEDs 50, pixelation is reduced.

As intended herein, pixelation refers to individually distinguishable pixels that, on a two-dimensional grid array of columns and rows of pixels in a display, results in visibly jagged edges or non-smooth diagonal lines or curves. This can occur when the display resolution is insufficient for the viewing distance and certain embodiments of the present invention can reduce this effect.

In some embodiments of the present invention, and with reference to FIG. 9C, in an exemplary embodiment of a full-color iLED display 99, an iLED 50 from each group in a pixel 20 is interdigitated with an iLED 50 from each group in an adjacent pixel 20. In some embodiments, only some groups have iLEDs 50 that are interdigitated with iLEDs 50 in adjacent pixels 20. For example, the color green carries the most luminance and high spatial frequency information for the human visual system. The green iLEDs 50G can be interdigitated and the other colors (e.g., red, blue) are not or vice versa. In some embodiments, only one of a plurality of groups of two or more commonly connected iLEDs 50 are spatially interdigitated with adjacent pixels 20. In some embodiments, iLEDs 50 from all but one group are interdigitated with adjacent pixels 20.

Figure 11:
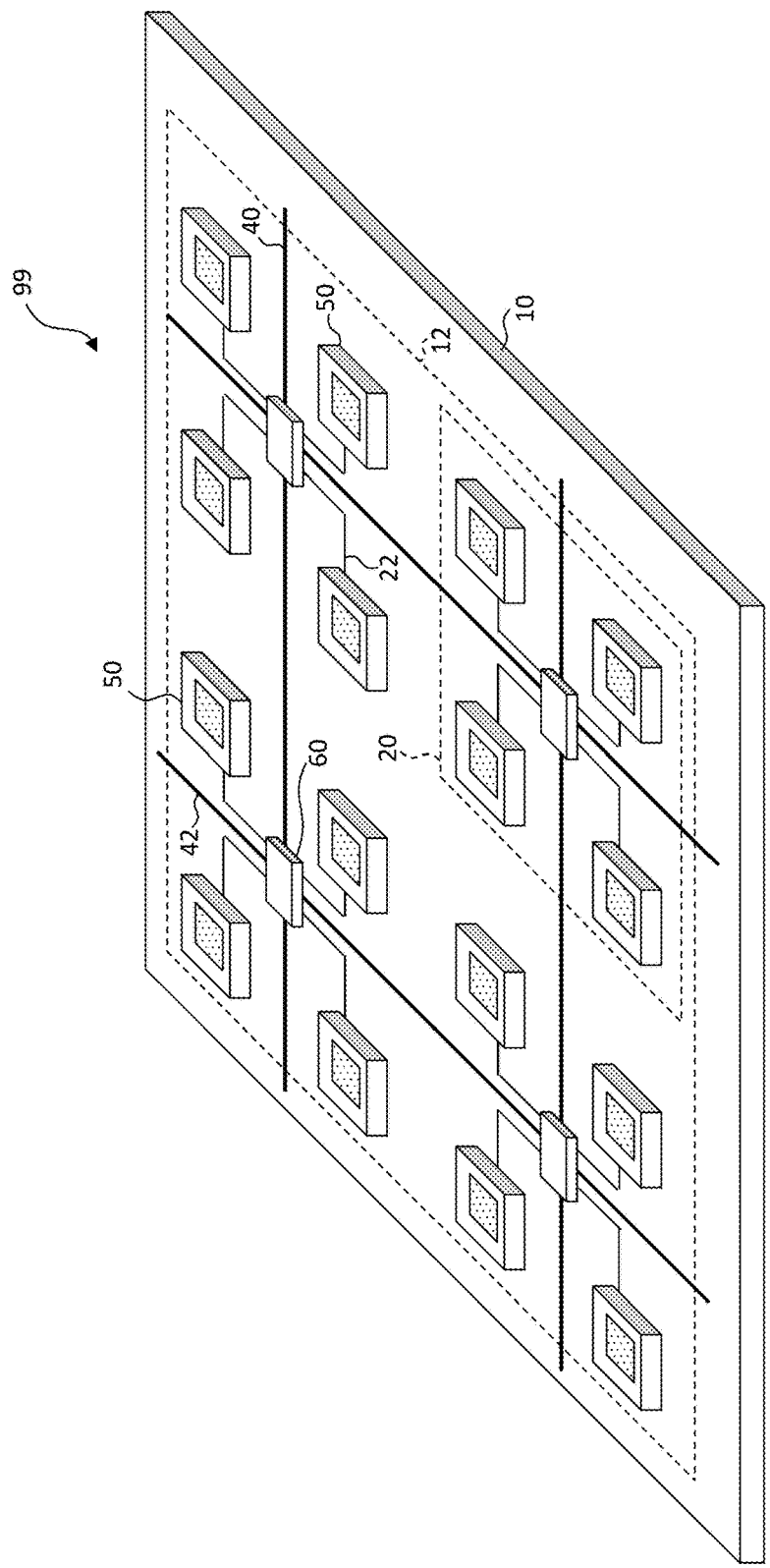
FIG. 11 is a perspective schematic of an iLED display, according to illustrative embodiments of the present invention.

In some embodiments, as illustrated in FIGS. 2-7 for example, passive-matrix iLED displays 99 comprise iLEDs 50 in which the iLEDs 50 are directly connected to row and column lines 40, 42 and are directly driven by row and column controllers 32, 34 under the direction of a display controller 30. In some embodiments of the present invention, and as shown in FIG. 11, pixels 20 include a pixel controller 60 that controls groups of iLEDs 50 through wires 22 in response to signals provided on row and column lines 40, 42. In some embodiments, a pixel controller 60 can be an integrated circuit that includes analog, digital, or mixed-signal circuitry.

In the exemplary embodiment illustrated in FIG. 11, the pixel controller 60 and the iLEDs 50 are all disposed directly on and in contact with the display substrate 10 in the display area 12. For clarity, the iLEDs 50 are illustrated as larger than the pixel controller 60, but in certain practical embodiments the pixel controller 60 can be much larger than the iLEDs 50. In FIG. 11, only some of the wires 22 that electrically connect the two or more iLEDs 50 in a group in common are shown. In some embodiments of the present invention, iLEDs 50 and a pixel controller 60 are transfer printed (e.g., micro-transfer printed) from respective source wafers to a display substrate 10. In some embodiments, each iLED 50 and pixel controller 60 includes one or more broken or separated tethers as a consequence of micro-transfer printing.

Figure 12A:
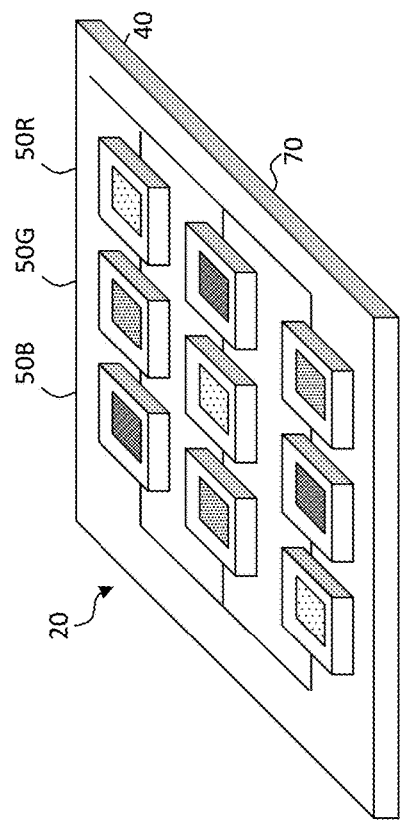
FIGS. 12A and 12B are perspective schematics of a passive-matrix and active-matrix color pixel, respectively, according to illustrative embodiments of the present invention.

As shown in FIG. 12A, in some embodiments, each pixel 20 includes a pixel substrate 70 on which iLEDs 50 are mounted. The pixel substrate 70 is disposed on a display substrate 10 in a display area 12 (not shown in FIG. 12A). The exemplary embodiment shown in FIG. 12A can be a passive-matrix embodiment or can include a pixel controller 60 disposed on the display substrate 10 to control the iLEDs 50. The iLEDs 50 each have an iLED substrate that is separate, independent, and distinct from the display substrate 10, other iLED substrates, or the pixel substrate 70. In some embodiments of the present invention, the iLEDs 50 are micro-transfer printed from one or more iLED source wafers to the pixel substrate 70 and each include one or more broken or separated tethers as a consequence of micro-transfer printing. In some embodiments, pixel substrates 70 are provided on a pixel substrate source wafer and the pixel substrates 70 are micro-transfer printed from the pixel substrate source wafer to a display substrate 10 and can also include one or more broken or separated tethers. In some embodiments, iLEDs 50 are micro-transfer printed from an iLED source wafer to a pixel substrate 70 while it is still a part of a pixel substrate source wafer. In some embodiments, iLEDs 50 are micro-transfer printed from an iLED source wafer to a pixel substrate 70 after the pixel substrate 70 is micro-transfer printed from a pixel substrate source wafer to a display substrate 10.

Figure 12B:
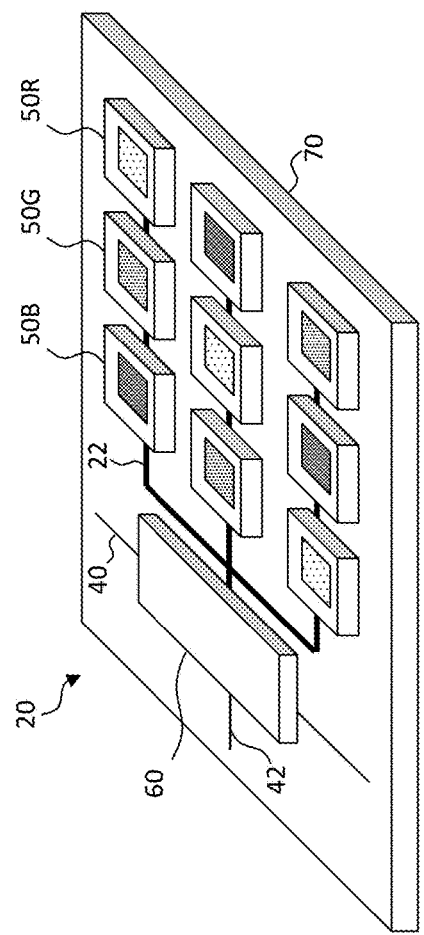

Referring to FIG. 12B, in an exemplary active-matrix embodiment of the present invention, each pixel 20 includes a pixel substrate 70 on which the iLEDs 50 and a pixel controller 60 are disposed. The pixel substrate 70 is disposed on the display substrate 10 in the display area 12. The pixel controller 60 controls the iLEDs 50 on the pixel substrate 70 to emit light in response to control signals, for example control signals provided on the row and column lines 40, 42 to the pixel controller 60. The pixel controller 60 can be micro-transfer printed from a controller source wafer to the pixel substrate 70 and can include a broken or separated tether. In some embodiments, the pixel substrates 70 are provided on a pixel substrate source wafer (80, see FIG. 15) and the pixel substrates 70 are micro-transfer printed from the pixel substrate source 80 wafer to the display substrate 10. The iLEDs 50 and the pixel controller 60 can be micro-transfer printed to the pixel substrate 70 before or after the pixel substrate 70 is micro-transfer printed from a pixel substrate source wafer to the display substrate 10.

In some embodiments, a pixel controller 60 includes a control circuit 61 and a controller substrate that is separate, independent, and distinct from a display substrate 10 and a pixel substrate 70. Each iLED 50 includes an iLED substrate that is separate, independent, and distinct from a display substrate 10, other iLED substrates, the controller substrate 62, and the pixel substrate 70, if present. The controller substrate and the iLED substrates are not distinguished in the Figures from the pixel controller 60 and the iLEDs 50, respectively. Similarly, the controller substrate 62 is separate, independent, and distinct from the display substrate 10, from the iLED substrates, and the pixel substrate 70, if present.

A substrate that is separate, independent, and distinct from another substrate can be made separately at a different time or at a different location using different materials or methods than the other substrate. Each separate, independent, and distinct substrate can exist and be processed, transported, or manipulated independently of any other separate, independent, and distinct substrate. In certain embodiments, each iLED 50, pixel controller 60, and pixel substrate 70 can be independently micro-transfer printed from one or more source wafers to respective destination substrates and can include broken or separated tethers.

Figure 13A:
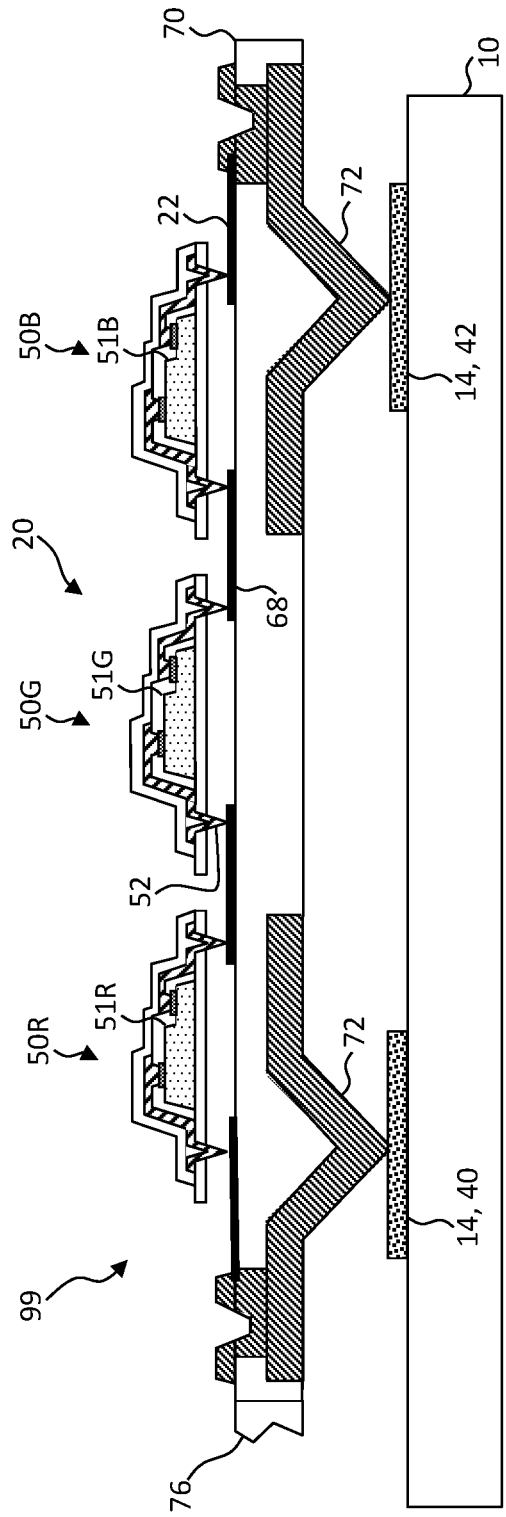
FIGS. 13A and 13B are cross section schematics of a passive-matrix and an active-matrix iLED display, respectively, according to illustrative embodiments of the present invention.
Figure 13B:
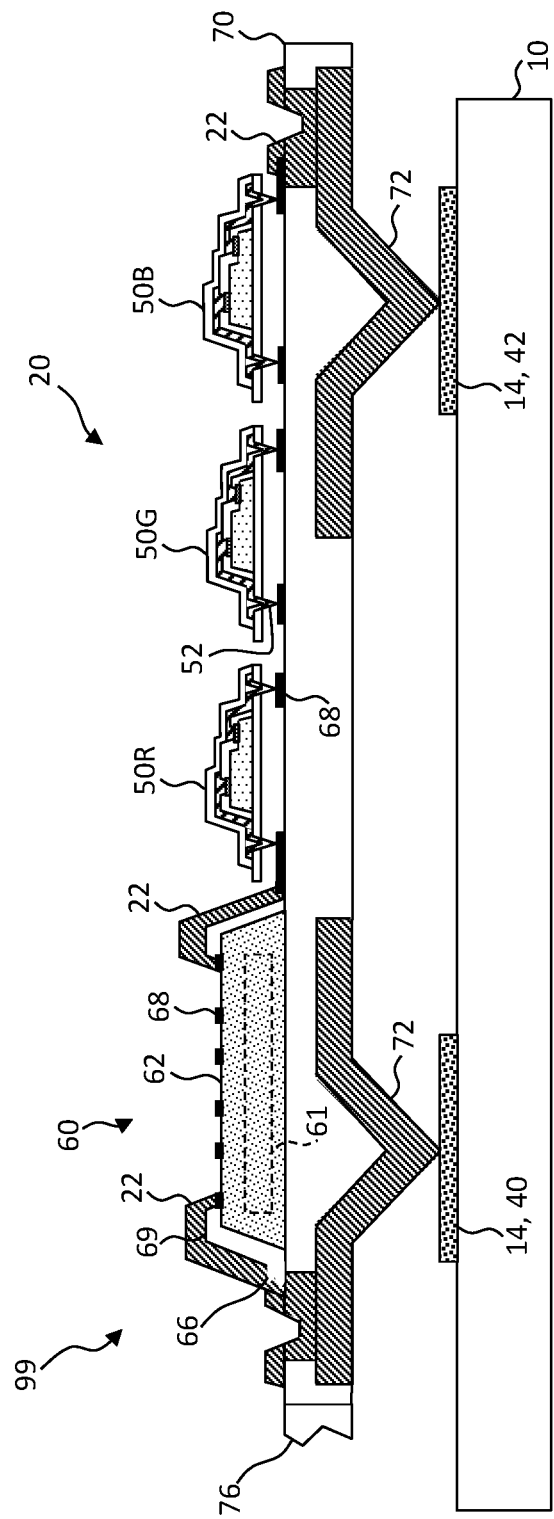

As shown in the cross section of FIG. 13A, and corresponding to the perspective of FIG. 12A, in some embodiments, a display substrate 10 includes display substrate contact pads 14 and a pixel substrate 70 includes pixel connection posts 72 that are electrically connected to the display substrate contact pads 14 and to iLEDs 50, for example directly through wires 22. Referring to FIG. 13B, the pixel 20 includes a pixel controller 60 having a control circuit 61 disposed on the pixel substrate 70 and electrically connected to the connection posts 72 through wires 22. The iLEDs 50 are indirectly connected to the row and column lines 40, 42 through the pixel controller 60. Portions of the pixel controller 60 are insulated by patterned dielectric 69 to prevent undesired contact with wires 22 or other electrodes. The use of connection posts to form micro-transfer printed electrical connections is discussed in more detail in U.S. patent application Ser. No. 15/373,865, filed Dec. 9, 2016 and entitled Micro-Transfer Printable Electronic Component and in U.S. patent application Ser. No. 14/822,864, filed Aug. 10, 2015 and entitled Chiplet with Connection Posts, the disclosure of each of which is hereby incorporated by reference.

Figure 14A:
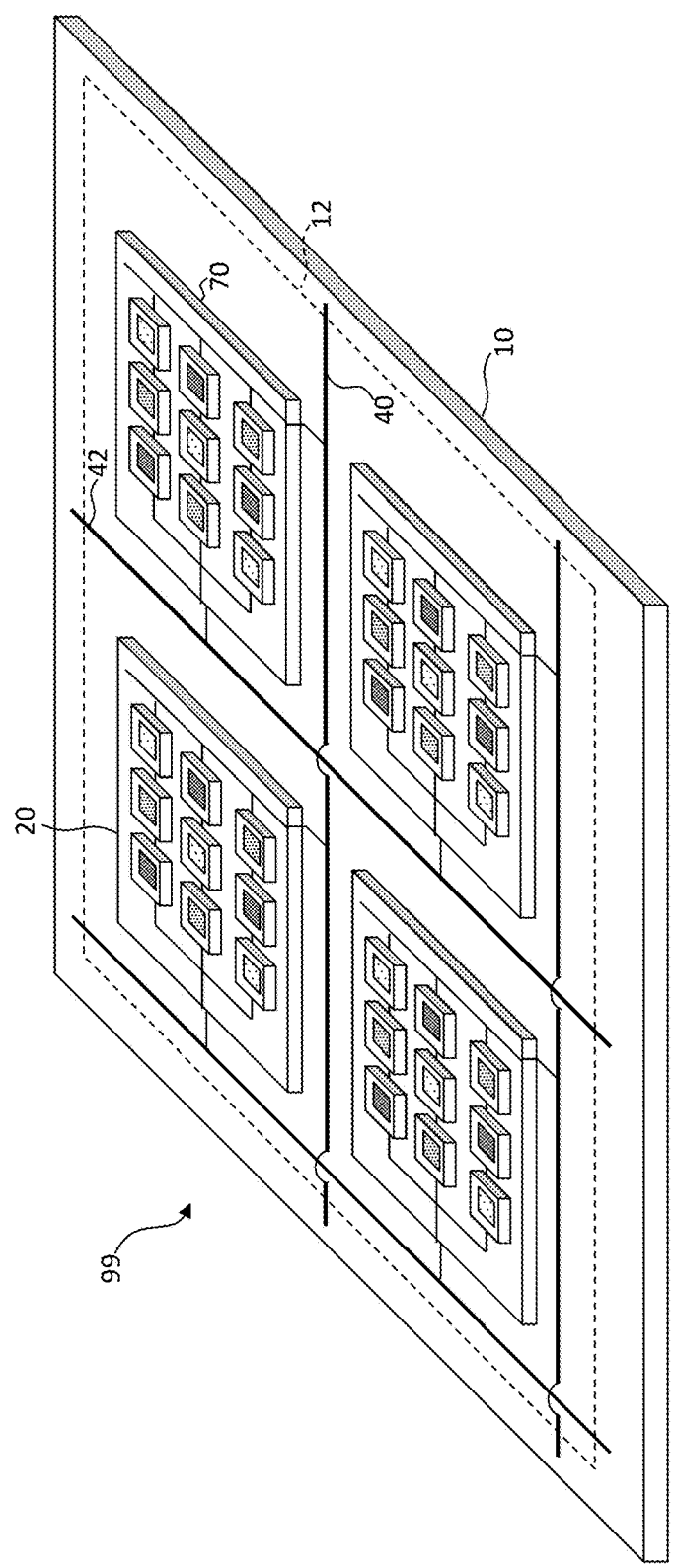
FIGS. 14A and 14B are perspective schematic of a passive- and an active-matrix display using the color pixels shown in FIGS. 12A and 12B and the cross sections shown in FIGS. 13A and 13B, respectively, according to illustrative embodiments of the present invention.
Figure 14B:
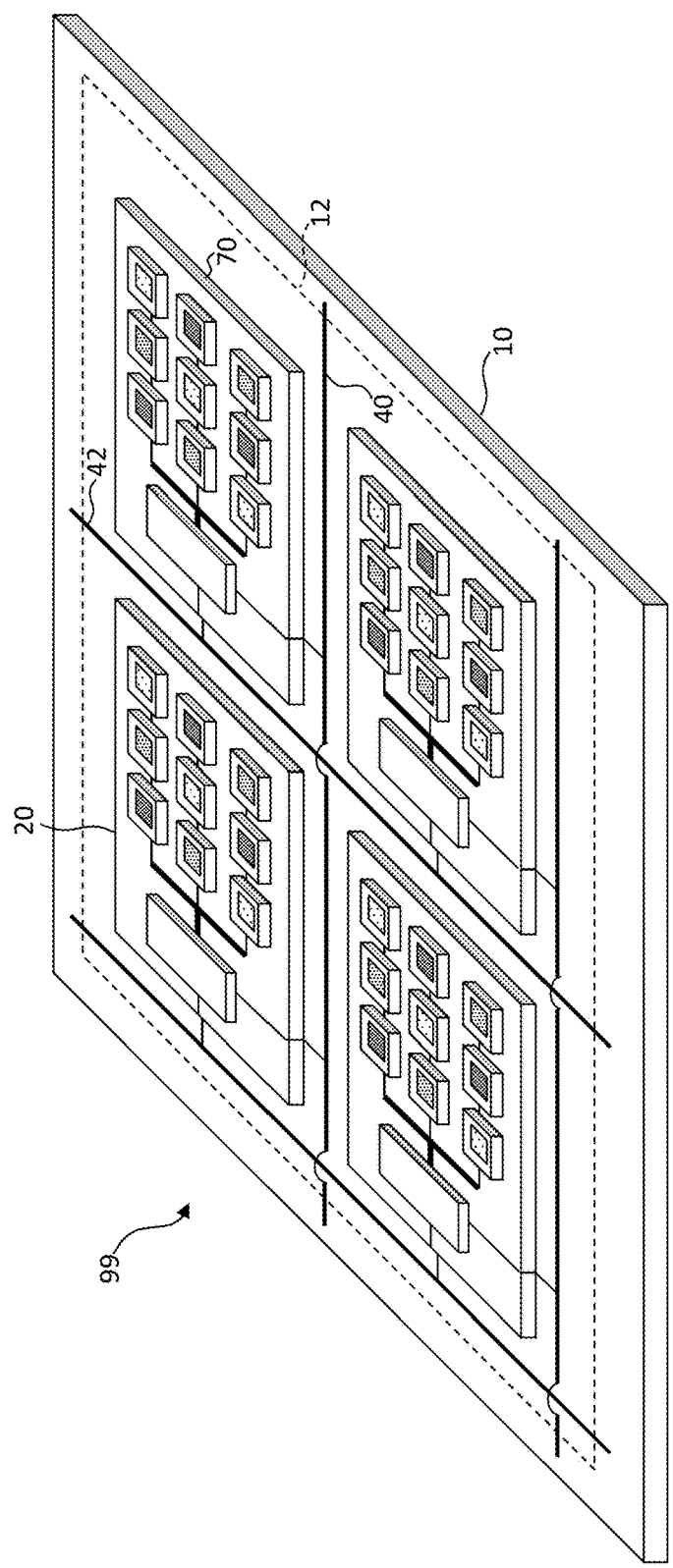

In certain passive-matrix embodiments, as shown in FIGS. 14A, 13A, and 12A, a pixel 20 includes a pixel substrate 70. Red, green, and blue iLEDs 50R, 50G, 50B (collectively iLEDs 50) are disposed on the pixel substrate 70. In certain active-matrix embodiments, as shown in FIGS. 14B, 13B, and 12B, a pixel controller 60 is also disposed on a pixel substrate 70. iLEDs 50 can also have iLED connection posts 52 electrically connected to pixel contact pads 68. In certain embodiments, pixel or iLED connection posts 72, 52 can enable electrical connections to corresponding display substrate contact pads 14 and pixel contact pads 68, respectively, by micro-transfer printing, thereby reducing the number of photolithographic steps needed to construct a display. iLEDs 50 can be micro-transfer printed onto a pixel substrate 70 and have a broken or separated tether (not shown). Similarly, a pixel controller 60 can be micro-transfer printed onto a pixel substrate 70 and comprise a broken or separated tether 66. In some embodiments, a pixel substrate 70 can be micro-transfer printed and comprise a broken or separated tether 76.

Figure 15:
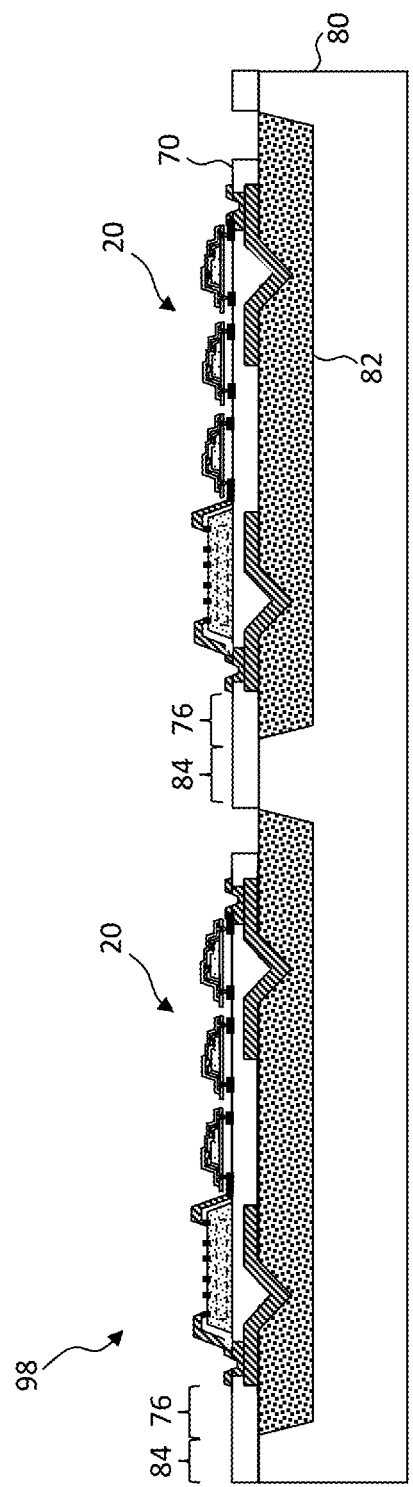
FIG. 15 is a cross section schematic of a pixel source wafer, according to illustrative embodiments of the present invention.

As shown in FIG. 15 as well as FIGS. 14A-B, in some embodiments of the present invention, a pixel source wafer 98 includes a source wafer 80 comprising a plurality of sacrificial portions 82. A pixel 20 is disposed entirely over a corresponding sacrificial portion 82. The pixel 20 has a pixel substrate 70, a group of two or more spatially separated iLEDs 50, each iLED 50 having a separate, independent, and distinct iLED substrate (e.g., any one of red iLED substrate 51R, green iLED substrate 51G, or blue iLED substrate 51B) different from the pixel substrate 70 and the source wafer 80. The two or more iLEDs 50 are electrically connected in common to emit light together in response to a control signal. In some embodiments, each pixel 20 comprises a pixel controller 60 electrically connected to iLEDs 50 to control the iLEDs 50 to emit light in response to the control signal. In various embodiments, pixel controllers 60 each include one or more broken or separated tethers 66 or iLEDs 50 each include one or more broken or separated tethers 66 (not shown). In some embodiments, a sacrificial portion 82 is etched, thereby defining a gap between a pixel substrate 70 and a source wafer 80 and, furthermore, defines a tether 76 connecting the pixel 20 to anchor 84 portions of the source wafer 80. The pixel 20 can include one or more pixel connection posts 72 electrically connected, either directly through wires 22 or indirectly through a pixel controller 60 to iLEDs 50. Pixels 20 can be micro-transfer printed from the source wafer 80 by contacting the pixels 20 with a stamp, breaking or separating the tethers 76 and adhering the pixels 20 to the stamp. The stamp is then transported to a display substrate 10 and the pixels 20 are contacted to the display substrate 10 and adhered to the substrate 10.

Power and ground electrical connections are not shown in the Figures to simplify the illustrations, but can be supplied to the pixels 20, pixel controllers 60, and row, column, or display controllers, 32, 34, 30.

Figure 16:
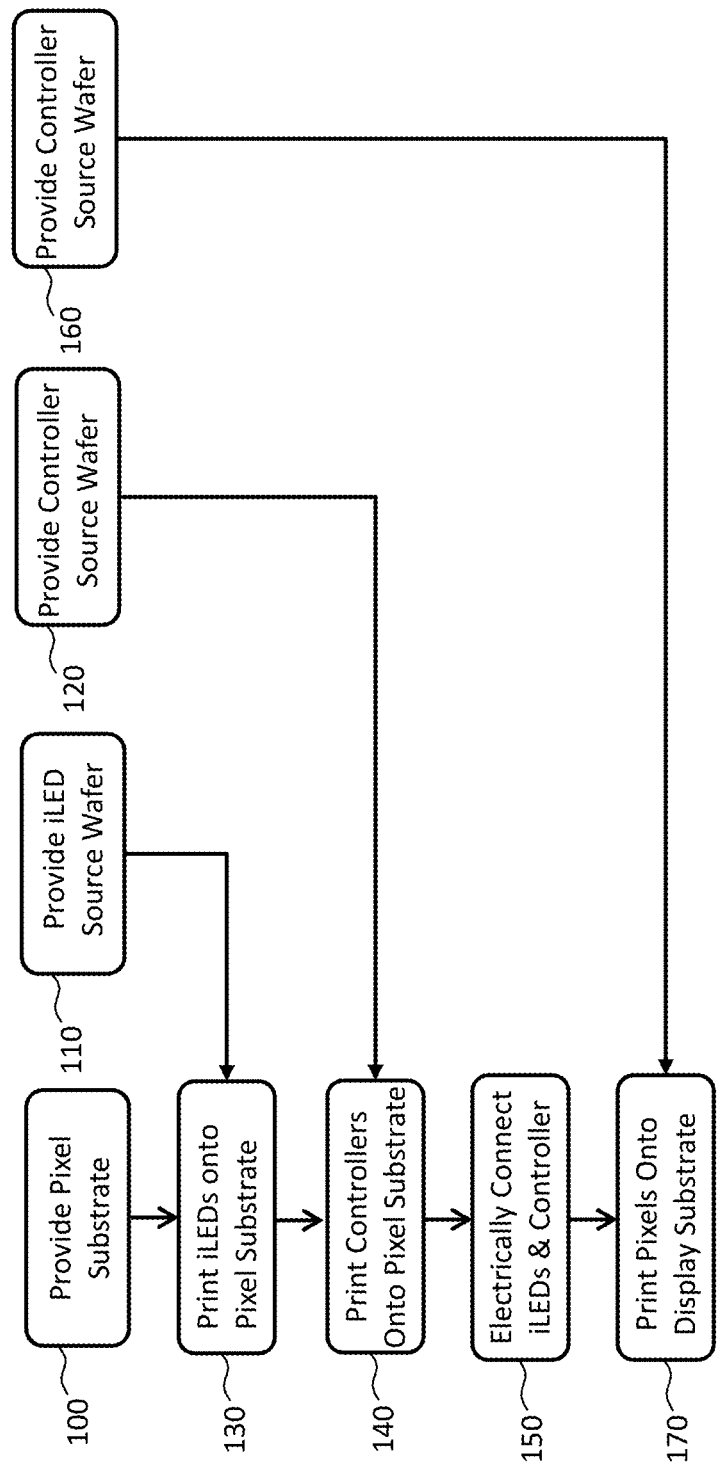
FIG. 16 is a flow chart illustrating an exemplary method, according to illustrative embodiments of the present invention.

Referring to FIG. 16, an exemplary method of making an iLED pixel 20 according to some embodiments of the present invention comprises providing in step 100 a pixel substrate 70 having at least two externally controlled control wires, wherein at least one control wire is a modulated control wire and the pixel substrate 70 has lateral dimensions less than 1 cm. A modulated control wire is a control wire that conducts a temporally varying electrical signal. An iLED source wafer having micro-transfer printable iLEDs 50 is provided in step 110, and a controller source wafer having micro-transfer printable pixel controllers 60 in step 120. In step 130, two or more iLEDs 50 are micro-transfer printed from the iLED source wafer to the pixel substrate 70. The pixel substrate 70 can be part of a source wafer 80. In step 140, in an active-matrix embodiment a pixel controller 60 is micro-transfer printed from the controller source wafer to the pixel substrate 70. In step 150, the two or more iLEDs 50 are electrically connected in common and are directly or indirectly electrically connected to the two control wires. The electrical connections for the iLEDs 50 can be made using photolithographic materials or methods or can be made, at least in part, as a consequence of providing the iLEDs 50 with iLED connection posts 52 and micro-transfer printing the iLEDs 50 to pixel contact pads 68 electrically connected to wires 22 and directly or indirectly to row or column lines 40, 42 or the pixel controller 60. Similarly, the electrical connections for the pixel controller 60 can be made using photolithographic materials or methods or can be made, at least in part, as a consequence of providing the pixel controller 60 with pixel connection posts 72 and micro-transfer printing the pixel controller 60 to pixel contact pads 68 electrically connected to wires 22 and directly or indirectly to row or column lines 40, 42. The pixel substrate 70 can be provided with wires 22 or other electrical connection and pixel contact pads 68 for the pixel 20, for example made using photolithographic methods and materials. In step 160, a display substrate 10 is provided and in step 170 the pixel substrate 70 is micro-transfer printed from a source wafer 80 onto the display substrate 10.

In some embodiments, iLEDs 50 or pixel controller are micro-transfer printed directly to the display substrate 10 and no pixel substrate 70 is used. In some embodiments, a pixel substrate 70 is micro-transfer printed to a display substrate 10 and iLEDs 50 are micro-transfer printed to the pixel substrate 70 before or after the pixel substrate 70 is micro-transfer printed. Similarly, in certain active-matrix embodiments, a pixel controller 60 is micro-transfer printed to a display substrate 10 or to a pixel substrate 70 before or after the pixel substrate 70 is micro-transfer printed to the display substrate 10.

In certain embodiments, a display substrate 10 has a contiguous display area 12 that includes the pixels 20 and the iLEDs 50 of the pixels 20 each have a light-emissive area. The display area 12 can include the entire surface of the display substrate 10 or can include only a single, connected, contiguous portion of the display area 12 that includes all of the pixels 20 (e.g., a convex hull of a plurality of pixels 20). According to various embodiments, an iLED display 99 includes a variety of designs having a variety of resolutions, iLED 50 sizes, and display areas 12. For example, display areas 12 ranging from 1 cm by 1 cm to 10 m by 10 m in size are contemplated.

In some embodiments of the present invention, iLEDs 50 are micro-light-emitting diodes (micro-LEDs), for example having light-emissive areas of less than 10, 20, 50, or 100 square microns. Such micro-LEDs have the advantage of a small light-emissive area compared to their brightness as well as color purity providing highly saturated display colors and a substantially Lambertian emission providing a wide viewing angle for an iLED display 99 according to some embodiments of the present invention. In various embodiments, a display area 12 is greater than or equal to two times, four times, eight times, ten times, twenty times, fifty times, one hundred times, two hundred times, five hundred times, one thousand, or ten thousand times the combined light-emissive areas of the iLEDs 50 disposed on the display substrate 10 with the display area 12. For example, if the red light-emissive area was 50-microns square, the green light-emissive area was 30-microns square, and blue light-emissive area was 40-microns square, the combined light-emissive areas of the iLEDs 50 in a pixel 20 would be 240 microns square if two iLEDs 50 are provided in each commonly controlled group in a pixel 20. The light-emissive area of the iLEDs 50 can be only a portion of the iLEDs 50. In a typical light-emitting diode, for example, not all of the semiconductor material in the light-emitting diode necessarily emits light.

iLEDs 50 can have a size of one square micron to 500 square microns, for example at least one of a height from 2 to 5 μm, 4 to 10 μm, 10 to 20 μm, or 20 to 50 μm, a length from 2 to 5 μm, 4 to 10 μm, 10 to 20 μm, or 20 to 50 μm, and a width from 2 to 5 μm, 4 to 10 μm, 10 to 20 μm, or 20 to 50 μm. In general, larger iLEDs 50 are most useful with, but are not limited to, larger display areas 12. The resolution of iLEDs 50 over a display substrate 10 can also vary, for example from fifty iLEDs 50 per inch to hundreds of iLEDs 50 per inch, or even thousands of iLEDs 50 per inch. For example, a three-color iLED display 99 having one thousand 10 μm×10 μm iLEDs 50 per inch (on a 25-micron pitch) has an aperture ratio of less than 16 percent (including only the iLEDs 50). Thus, some embodiments of the present invention have application in low-resolution displays and some embodiments of the present invention have application in very high-resolution displays. Note that, because each pixel 20 has two or more iLEDs 50, the pixel resolution (controllable pixel elements) is different from the iLED 50 resolution.

According to some embodiments of the present invention, a display substrate 10 can include layers formed on an underlying structure or substrate, for example a rigid or flexible glass or plastic substrate. In some embodiments, iLEDs 50 are transferred from another substrate (such as a compound semiconductor wafer) to a display substrate 10 or pixel substrate 70 (for example made of glass or silicon) so that the iLEDs 50 or pixel controllers 60 are non-native to the display substrate 10 or pixel substrate 70. In certain embodiments, this arrangement has the advantage of using a crystalline silicon or compound semiconductor substrate that provides higher-performance integrated circuit components than can be made in amorphous or polysilicon semiconductors available on a large substrate such as a display substrate 10.

In certain embodiments, a display controller 30 controls an iLED display 99 by, for example, providing power, a ground reference signal, and control signals through buses 44 or row and columns lines 40, 42. The display controller 30 can include a row controller 32 or column controller 34, or they can be considered as different elements and can be different integrated circuits with different semiconductor substrates.

In some embodiment of the present invention, iLEDs 50 or a pixel controller 60 is disposed on or over a pixel substrate 70 smaller than and separate and distinct from a display substrate 10. Compound micro-assembly is used to assemble iLEDs 50 on a pixel substrate 70 to form a pixel 20 and the pixel 20 is then printed to the display substrate 10. In some embodiments, other devices, for example pixel controllers 60, are also printed to the pixel substrate 70 and electrically interconnected to form the pixel 20. A discussion of compound micro-assembly structures and methods is provided in U.S. patent application Ser. No. 14/822,868, filed Aug. 10, 2015, entitled Compound Micro-Assembly Strategies and Devices.

In some embodiments, a display substrate 10 can include material, for example glass or plastic, different from a material in the semiconductor substrate, for example a semiconductor material such as silicon. As described with respect to FIG. 16, in certain embodiments, iLEDs 50 or a pixel controller 60 are disposed on the pixel substrate 70 and the pixel substrate 70 is separately disposed on the display substrate 10. In some embodiments, a pixel controller 60 or iLEDs 50 can be formed separately on separate semiconductor substrates, assembled onto a pixel substrate 70, and then the assembled unit is disposed on the surface of a display substrate 10 in a display area 12. The assembled unit (e.g., pixel 20) can be micro-transfer printed or can be a surface-mount component. This arrangement has the advantage that the pixels 20 can be separately tested before they are located on the display substrate 10, thus improving yields and reducing costs.

In some embodiments of the present invention, iLEDs 50 emit light through a display substrate 10 or pixel substrate 70. In some embodiments, iLEDs 50 emit light in a direction opposite a display substrate 10 or pixel substrate 70.

iLED displays 99 according to certain embodiments of the present invention can be operated in a variety of useful ways. In certain embodiments, a display controller 30 provides power, a ground reference, and control signals to pixels 20 in the iLED display 99 through buses 44, row lines 40, column lines 42, and electrically conductive wires 22. The signals can provide a passive-matrix control of the iLEDs 50 in the pixels 20. In some embodiments, pixels 20 include a pixel controller 60. A display controller 30 is connected to the pixel controller 60 through buses 44, row lines 40, column lines 42, and electrically conductive wires 22 and provides control signals for operating the iLEDs 50 in the pixel 20 through the pixel controller 60, for example in an active-matrix control configuration. The iLEDs 50 are connected to the pixel controller 60 through wires 22. Thus, iLEDs 50 can be electrically connected to row and column lines 40, 42 directly through wires 22, or indirectly through wires 22 and a pixel controller 60.

A display substrate 10 can be any conventional substrate such as glass, plastic, or metal or include such materials. A display substrate 10 can be transparent, for example having a transmissivity greater than or equal to 50%, 80%, 90%, or 95% for visible light. In certain embodiments, a display substrate 10 usefully has two opposing smooth sides suitable for material deposition, photolithographic processing, or micro-transfer printing of micro-iLEDs 50 and pixel substrates 70. A display substrate 10 can have a size of a conventional display, for example a rectangle with a diagonal of a few centimeters to one or more meters and, optionally, a thickness of no more than 0.1 mm, 0.5 mm, 1 mm, 5 mm, 10 mm, or 20 mm. Such substrates are commercially available. Micro-iLED 50 semiconductor substrates are much smaller than and separate and distinct from a display substrate 10 or, in some embodiments, a pixel substrate 70. Any one or all of a pixel controller 60, row controller 32, column controller 34, or display controller 30 can be made using photolithographic integrated circuit processes on semiconductor substrates, using analog, digital, or mixed-signal circuits.

Conductive wires 22 and row or column lines 40, 42 and any power or ground lines are formed on their respective substrates using photolithographic and substrate processing techniques, for example photolithographic processes employing metal or metal oxide deposition using evaporation or sputtering, curable resin coatings (e.g., SU8), positive or negative photo-resist coating, radiation (e.g., ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. Methods can include forming capacitors, shaped conductors such as antennas or inductors, and digital, analog, or mixed-signal circuits.

Electrical interconnections or wires 22 on a pixel substrate 70 can be fine interconnections, for example having at least one of a width of less than 50 µm, less than 20 µm, less than 10 µm, less than five µm, less than two µm, or less than one µm and a thickness less than or equal to ten µm, five µm, two µm, or one µm. On a display substrate 10, electrical connections or wires can include one or more coarse lithography interconnections having a width from 2 µm to 2 mm, wherein each coarse lithography interconnection is electrically connected to at least one of a plurality of pixels 20 on the display substrate 10. Electrical connections on a display substrate 10, for example row and column lines 40, 42 and any power and ground lines, can be relatively coarse (having a greater width and spacing) compared to fine interconnections on a pixel substrate 70. In general, coarse lithography interconnections have a dimension larger than an equivalent dimension in fine interconnections. Thus, pixel substrates 70 with fine interconnections can be relatively small and made using integrated circuit photolithography methods and materials suitable to relatively small substrates and wafers. In contrast, a display substrate 10 is relatively large and it is expensive or difficult to make such fine interconnections on and over the extent of a display substrate. Thus, in an exemplary lower-cost method, wider and lower-resolution coarse interconnections are made on a larger display substrate 10, for example using printed-circuit board methods and materials, compared to fine interconnections on a pixel substrate 70.

In some embodiments, micro-iLEDs 50 are transfer printed to a pixel substrate 70 or display substrate 10. For a discussion of micro-transfer printing techniques see, U.S. Pat. Nos. 8,722,458, 7,622,367 and 8,506,867, the disclosure of each of which is hereby incorporated by reference. The transferred micro-iLEDs 50 are then interconnected (e.g., in accordance with step 140), for example with conductive wires 22 and optionally including connection pads and other electrical connection structures (e.g., connection posts), to enable a display controller 30 to electrically interact with the micro-iLEDs 50 to emit light in an iLED display 99. In some embodiments, transfer or construction of micro-iLEDs 50 is performed before or after all conductive wires 22 are in place. Thus, in some embodiments, construction of conductive wires 22 can be performed before micro-iLEDs 50 are printed or after micro-iLEDs 50 are printed, or both. In some embodiments, a display controller 30 is externally located (for example on a separate printed circuit board substrate) and electrically connected to a bus 44 and other electrical conductors using connectors, ribbon cables, or the like. In some embodiments, a display controller 30 is affixed to a display substrate 10 outside a display area 12 and electrically connected to a bus 44 and other electrical conductors, for example using surface mount and soldering technology (not shown).

In an exemplary process according to certain embodiments of the present invention, a pixel controller 60 is provided, for example using semiconductor integrated circuit processes. A pixel controller 60 or pixel substrate 70 can be provided at the same time as, before, or after micro-iLEDs 50, on separate semiconductor wafers, or on the same semiconductor wafer. iLEDs 50 and a pixel controller 60 can be micro-transfer printed to a pixel substrate 70 or display substrate 10, either in a common transfer step or separate transfer steps from the same or different semiconductor wafers. A pixel substrate 70 can, for example, be similar to a display substrate 10 (e.g., made of glass or plastic) but in a much smaller size, for example having an area of 50 square microns, 100 square microns, 500 square microns, or 1 square mm and can be only a few microns thick, for example 5 microns, 10 microns, 20 microns, or 50 microns. In some embodiments, a pixel substrate 70 is a semiconductor such as silicon. In some embodiments, not shown, a pixel substrate 70 includes a semiconductor and a pixel controller 60, or some electrical circuitry, and some electrical interconnections such as wires 22, are formed in the pixel substrate 70. In an optional step according to certain embodiments, pixels 20 are tested and accepted, repaired, or discarded before transferring (e.g., micro-transfer printing) to a display substrate 10.

In certain embodiments, by employing a multi-step transfer or compound assembly process, increased yields are achieved and thus reduced costs for an iLED display 99. Additional details useful in understanding and performing aspects of certain embodiments of the present invention are described in U.S. patent application Ser. No. 14/743,981, filed Jun. 18, 2015, entitled Micro Assembled LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer includes another layer there between. Similarly, "row" and "column" are relative terms and can be exchanged within the meaning of the present invention.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

The order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

S separation distance
10 display substrate
12 display area
14 display substrate contact pad
20 pixel
20A pixel
20B pixel
20C pixel
20D pixel
22 wires
30 display controller
32 row controller
34 column controller
40 row line
40R red row line
40G green row line
40B blue row line
42 column line
42R red column line
42G green column line
42B blue column line
44 bus
50 inorganic light-emitting diode (iLED)
50R red iLED
50G green iLED
50B blue iLED
51R red iLED substrate
51G green iLED substrate
51B blue iLED substrate
52 iLED connection post
60 pixel controller
61 control circuit
62 controller substrate
66 pixel controller tether or iLED tether
68 pixel contact pad
69 dielectric
70 pixel substrate
72 pixel connection post
76 pixel tether
80 source wafer
82 sacrificial portion
84 anchor
90 detail, circle
98 pixel source wafer
99 iLED display
100 provide pixel substrate step
110 provide iLED source wafer step
120 provide controller source wafer step
130 micro-transfer print iLEDs onto pixel substrate step
140 micro-transfer print controllers onto pixel substrate step
150 electrically connect iLEDs and controller step
160 provide display substrate step
170 micro-transfer print pixels onto display substrate step

What is claimed:

1. An inorganic light-emitting diode (iLED) display, comprising:
   a display substrate having a display area; and
   a plurality of spatially separated pixels distributed on or over the display substrate in the display area, wherein each pixel comprises two or more groups of two or more spatially separated iLEDs each comprising an iLED substrate separate, independent, and distinct from the display substrate, the two or more iLEDs in the group electrically connected in common to emit light together in response to a control signal,
   wherein at least one of the two or more iLEDs in one of the two or more groups electrically connected in common to emit light together in response to a control signal are spatially interdigitated between the two or more iLEDs in another different one of the two or more groups electrically connected in common to emit light together in response to another different control signal.

2. The iLED display of claim 1, wherein the two or more iLEDs in the group are connected in parallel.

3. The iLED display of claim 1, wherein the two or more iLEDs in the group are connected in serial.

4. The iLED display of claim 1, wherein the two or more iLEDs in the group emit a same color of light.

5. The iLED display of claim 1, wherein the two or more iLEDs in the group each emit a different color of light and the different color of light from each of the two or more iLEDs together is perceived to be white.

6. The iLED display of claim 1, wherein the plurality of spatially separated pixels are distributed in a regular array over the display area.

7. The iLED display of claim 1, wherein each pixel of the plurality of spatially separated pixels comprises a first group of two or more iLEDs and a second group of two or more iLEDs different from the first group, and the two or more iLEDs in the first group emit light of a different color than the two or more iLEDs in the second group.

8. The iLED display of claim 7, wherein the two or more iLEDs in the first group are interdigitated with the two or more iLEDs in the second group of the pixel.

9. The iLED display of claim 1, wherein each pixel of the plurality of spatially separated pixels comprises a first group of two or more iLEDs, a second group of two or more iLEDs, and a third group of two or more iLEDs, and wherein the first, second, and third groups are all different groups, and the first group emits red light, the second group emits green light, and the third group emits blue light.

10. The iLED display of claim 9, the two or more iLEDs of each of the first, second, and third groups are interdigitated with the two or more iLEDs of the other two groups in the pixel.

11. The iLED display of claim 1, wherein the iLED display is a full-color display.

12. The iLED display of claim 1, wherein the iLED display is a passive-matrix display.

13. The iLED display of claim 12, wherein each pixel of the plurality of spatially separated pixels comprises a pixel substrate on which the group of the two or more iLEDs is disposed, the pixel substrate disposed on the display substrate.

14. The iLED display of claim 13, wherein the display substrate comprises display substrate contact pads and the pixel substrate of each of the plurality of spatially separated pixels comprises pixel connection posts that are electrically connected to at least a portion of the contact pads and to the two or more iLEDs.

15. The iLED display of claim 1, wherein the iLED display is an active-matrix display.

16. The iLED display of claim 15, comprising a pixel controller for each pixel of the plurality of spatially separated pixels, wherein the pixel controller comprises a controller substrate separate, independent, and distinct from the display substrate and the iLED substrate of each of the two or more iLEDs, that controls the two or more iLEDs to emit light in response to the control signal.

17. The iLED display of claim 16, wherein the controller substrate is disposed on a pixel substrate of the pixel.

18. The iLED display of claim 17, wherein the display substrate comprises contact pads and the pixel substrate comprises connection posts that are electrically connected to at least a portion of the contact pads and to the pixel controller.

19. The iLED display of claim 1, wherein the plurality of pixels comprises a first pixel and a second pixel spatially adjacent to the first pixel and wherein at least one of the two or more iLEDs of the first pixel is disposed between two of the two or more iLEDs of the second pixel so that the first pixel overlaps the second pixel over the display substrate.

20. The iLED display of claim 19, wherein the plurality of pixels comprises a third pixel spatially adjacent to the first pixel on a side of the first pixel opposite the second pixel and wherein at least one of the two or more iLEDs of the first pixel is disposed between two of the two or more iLEDs of the third pixel so that the first pixel overlaps the third pixel over the display substrate.

21. The iLED display of claim 20, wherein the first pixel has four sides and the plurality of pixels comprises a fourth pixel and a fifth pixel, each of the second, third, fourth and fifth pixels is spatially adjacent to a different one of the four sides, and wherein at least one of the two or more iLEDs of the first pixel is disposed between two of the two or more iLEDs of the second pixel, at least one of the two or more iLEDs of the first pixel is disposed between two of the two or more iLEDs of the third pixel, at least one of the two or more iLEDs of the first pixel is disposed between two of the two or more iLEDs of the fourth pixel, and at least one of the two or more iLEDs of the first pixel is disposed between two of the two or more iLEDs of the fourth pixel.

22. A pixel source wafer, comprising:
a source wafer substrate comprising a plurality of sacrificial portions; and
a plurality of pixels each disposed entirely over a corresponding sacrificial portion of the plurality of sacrificial portions, each pixel comprising a pixel substrate and two or more groups of two or more spatially separated iLEDs each comprising an iLED substrate separate, independent, and distinct from the pixel substrate and the source wafer substrate, the two or more iLEDs electrically connected in common to emit light together in response to a control signal,
wherein at least one of the two or more iLEDs in one of the two or more groups electrically connected in common to emit light together in response to a control signal are spatially interdigitated between the two or more iLEDs in another different one of the two or more groups electrically connected in common to emit light together in response to another different control signal.

23. The pixel source wafer of claim 22, wherein each pixel of the plurality of pixels comprises a pixel controller electrically connected to the two or more iLEDs to control the two or more iLEDs to emit light in response to the control signal.

24. The pixel source wafer of claim 23, wherein the pixel controller of each of the plurality of pixels comprises a broken or separated tether.

25. The pixel source wafer of claim 22, wherein the two or more iLEDs of each of the plurality of pixels each comprise a broken or separated tether.

26. The pixel source wafer of claim 22, wherein the corresponding sacrificial portion defines a gap between the pixel substrate and the source wafer such that one or more tethers connect each of the plurality of pixels disposed over the corresponding sacrificial portion to one or more anchor portions of the source wafer.

27. The pixel source wafer of claim 22, wherein each pixel of the plurality of pixels comprises one or more connection posts.

* * * * *